(12) United States Patent
Noack

(10) Patent No.: US 11,387,254 B2
(45) Date of Patent: Jul. 12, 2022

(54) MEMORY CELL AND METHODS THEREOF

(71) Applicant: Ferroelectric Memory GmbH, Dresden (DE)

(72) Inventor: Marko Noack, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 96 days.

(21) Appl. No.: 17/085,444

(22) Filed: Oct. 30, 2020

(65) Prior Publication Data

US 2022/0139933 A1    May 5, 2022

(51) Int. Cl.
| | | |
|---|---|---|
| *G11C 11/22* | (2006.01) | |
| *H01L 27/1159* | (2017.01) | |
| *H01L 49/02* | (2006.01) | |
| *H01L 29/06* | (2006.01) | |
| *H01L 29/423* | (2006.01) | |
| *H01L 29/786* | (2006.01) | |
| *H01L 29/78* | (2006.01) | |
| *H01L 29/66* | (2006.01) | |
| *H01L 29/51* | (2006.01) | |

(52) U.S. Cl.
CPC ........ *H01L 27/1159* (2013.01); *G11C 11/223* (2013.01); *G11C 11/2273* (2013.01); *H01L 28/60* (2013.01); *H01L 29/0673* (2013.01); *H01L 29/42392* (2013.01); *H01L 29/516* (2013.01); *H01L 29/6684* (2013.01); *H01L 29/7851* (2013.01); *H01L 29/78391* (2014.09); *H01L 29/78696* (2013.01)

(58) Field of Classification Search
CPC ........... H01L 27/1159; H01L 29/78391; H01L 28/60; H01L 29/0673; H01L 29/32392; H01L 29/516; H01L 29/6684; H01L 29/7851; H01L 29/78696; G11C 11/2273
USPC ................................................. 365/145, 149
See application file for complete search history.

(56) References Cited

U.S. PATENT DOCUMENTS

| | | | | |
|---|---|---|---|---|
| 10,438,645 | B2 * | 10/2019 | Müller | H01L 29/516 |
| 10,460,788 | B2 * | 10/2019 | Müller | G11C 11/223 |
| 11,081,159 | B1 * | 8/2021 | Jähne | G11C 11/2255 |
| 11,158,361 | B2 * | 10/2021 | Müller | G11C 11/2273 |

(Continued)

OTHER PUBLICATIONS

Mahmoodi-Meimand et al., "Data-Retention Flip-Flops for Power-Down Applications", IEEE, dated 2014, 4 pages.

(Continued)

*Primary Examiner* — Viet Q Nguyen
(74) *Attorney, Agent, or Firm* — Hickman Becker Bingham Ledesma LLP; Malgorzata A. Kulczycka

(57) ABSTRACT

According to various aspects, a memory cell comprise: a first terminal, a second terminal, a third terminal, a fourth terminal, and a fifth terminal to control the memory cell; a first memory element (FeFET1) and a second memory element (FeFET2), the first memory element comprising a first capacitive memory structure electrically connected to the first terminal and a first field-effect transistor structure coupled to the first capacitive memory structure and electrically connected to the third terminal and the forth terminal; the second memory element comprising a second capacitive memory structure electrically connected to the second terminal and a second field-effect transistor structure coupled to the second capacitive memory structure and electrically connected to the third terminal and the fifth terminal.

20 Claims, 23 Drawing Sheets

(56) References Cited

U.S. PATENT DOCUMENTS

| | | | | |
|---|---|---|---|---|
| 11,189,331 | B1* | 11/2021 | Benoist | G11C 11/2259 |
| 11,205,467 | B2* | 12/2021 | Slesazeck | G11C 11/5657 |
| 11,289,145 | B2* | 3/2022 | Ocker | H01L 28/60 |
| 2002/0066915 | A1* | 6/2002 | Ford | H01L 27/11585 |
| | | | | 257/295 |
| 2017/0178711 | A1* | 6/2017 | Morris | G11C 11/2297 |
| 2019/0012593 | A1* | 1/2019 | Obradovic | G06N 3/063 |
| 2020/0037484 | P1* | 1/2020 | Shaw | A01H 5/08 |
| | | | | Plt./208 |

OTHER PUBLICATIONS

Kimura et al., "A 2.4 PJ Ferroelectric-Based Non-Volatile Flip-Flop with 10-Year Data Retention Capability", IEEE Asian Solid-State Circuits Conference, dated Nov. 2014, 4 pages.

Wang et al., "Ferroelectric Transistor based Non-Volatile Flip-Flop", *ISLPED '16*, Aug. 8-10, 2016, 6 pages.

Wang et al. "A Compare-and-write Ferroelectric Nonvolatile Flip-Flop for Energy-Harvesting Applications", IEEE, dated 2010, 5 pages.

\* cited by examiner

MEMORY CELL AND METHODS THEREOF

TECHNICAL FIELD

Various aspects relate to a memory cell and methods thereof, e.g. a method for forming the memory cell.

BACKGROUND

In general, various computer memory technologies have been developed in the semiconductor industry. A fundamental building block of a computer memory architecture may be referred to as memory cell. The memory cell may be an electronic circuit that is configured to store at least one information (e.g., bitwise). As an example, the memory cell may have at least two memory states representing, for example, a logic "1" and a logic "0." In general, the information may be maintained (stored) in a memory cell until the memory state of the memory cell is modified, e.g., in a controlled manner. The information stored in the memory cell may be obtained by determining, in which of the memory states the memory cell is residing in. At present, various types of memory cells may be used to store data. By way of example, a type of memory cell may include a thin film of ferroelectric material, whose polarization state may be changed in a controlled fashion to store data in the memory cell, e.g. in a non-volatile manner. The memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
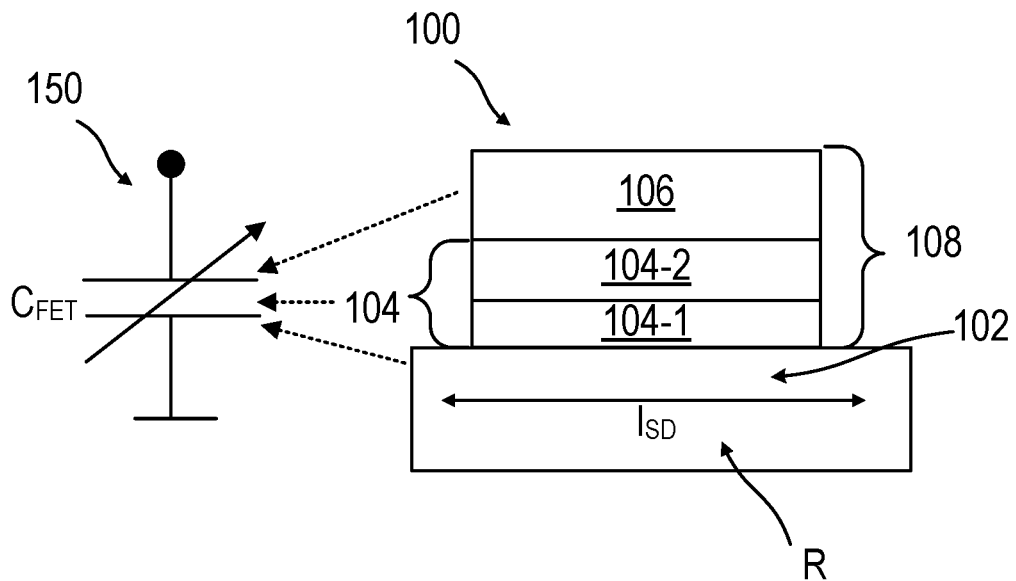
FIG. 1 shows schematically a field-effect transistor structure, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a field-effect transistor structure, a memory cell, or an electronic device). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one field-effect transistor (FET) structure. In some aspects, a memory cell may include a field-effect transistor structure and a capacitive memory structure coupled to a gate electrode of the field-effect transistor structure. The amount of charge stored in the capacitive memory structure may influence the threshold voltage(s) of the field-effect transistor structure. The threshold voltage(s) of the field-effect transistor structure may define the memory state the memory cell is residing in. In some aspects, the capacitive memory structure may be a ferroelectric capacitor structure (also referred to as FeCAP) coupled to a gate electrode of the field-effect transistor structure to provide a ferroelectric field-effect transistor (also referred to as FeFET) structure. Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. A ferroelectric material may turn a ferroelectric capacitor structure into a non-volatile capacitor based memory structure, e.g. by controlling the amount of charge stored in the capacitor structure. In other aspects, a non-volatile memory technology may be based on at least one capacitive memory structure. The capacitive memory structure may be or may include a ferroelectric capacitor structure. The amount of charge stored in the capacitive memory structure may be read-out by suitable electronic read-out signal converters, e.g., by a charge to voltage converter, by a determination of a switching current of the capacitive memory structure.

A ferroelectric field-effect transistor (FeFET) based memory cell element may include two components, a transistor and a ferroelectric capacitor (FeCAP). Increasing the FeFET performance may include one or more adjustments of the FeCAP layer stack. The FeCAP layer stack may include different materials, which may be adapted to increase ferroelectricity and reduce parasitic effects. A reduction of the FeCAP layer stack leakage by modification of electrode materials as well as electrode crystallographic structure may be implemented, in some aspects, to induce different crystallographic behavior in FE material.

Various aspects may be related to a memory element and/or a memory cell including two or more memory elements in a differential configuration. The memory element may include a capacitive memory structure and a field-effect transistor structure coupled to one another, e.g., the gate of the field-effect transistor structure may be coupled to an electrode of the capacitive memory structure. The capacitive memory structure may include a spontaneously polarizable material, e.g., a remanent-polarizable material, e.g., a ferroelectric material. In the case that the capacitive memory structure of the memory element utilizes a ferroelectric material to store data, the memory element may be referred to as ferroelectric memory element or ferroelectric field-effect transistor. In the following, e.g., with reference to FIGS. 1, 2, and 3A to 3E, various aspects of a field-effect transistor structure, a capacitive memory structure, and a memory element including a field-effect transistor structure and a capacitive memory structure coupled with one another are described.

According to various aspects, a semiconducting material, layer, region or the like may be understood as having moderate electrical conductivity (also referred to as semiconducting), e.g. an electrical conductivity (measured at room temperature and constant electric field direction, e.g. constant electric field) in the range from about $10^{-6}$ Siemens per meter (S/m) to about $10^6$ S/m. According to various aspects, an electrically conductive material (e.g. a metallic material), layer, region or the like may be understood as having high electrical conductivity (also referred to as electrical conducting), e.g. an electrical conductivity (measured at room temperature and constant electric field direction, e.g. constant electric field) greater than about $10^6$ S/m, e.g. greater than about $10^7$ S/m. According to various aspects, an electrically insulating material, layer, region or the like may be understood as having a low electrical conductivity (also referred to as electrically insulating), e.g. an electrical conductivity (measured at room temperature and constant electric field direction, e.g. constant electric field) less than about $10^{-6}$ S/m, e.g. less than about $10^{-10}$ S/m.

According to various aspects, a semiconducting material, layer, region or the like have a typical band gap between the valence and conduction bands that results in a negative temperature coefficient of the electrical resistivity. For example, the electrical properties of an intrinsic semiconducting material, layer, region or the like may be modified by doping, e.g. by p-doping (providing a p-type doping) or n-doping (providing an n-type doping). Lightly and moderately doped semiconductors are referred to as extrinsic semiconductors. However, a semiconductor may be doped to such high level that it is similar to a metallic conductor (referred to as a degenerate semiconductor or degenerate doping). Two oppositely doped semiconducting materials and/or two different types of semiconducting materials can be joined together to a junction, also referred to as p-n junction or as semiconducting junction. Such p-n junction may be generally used in semiconductor technology to form diodes, transistors or the like.

In the following, reference is made to various voltages, among others such as $V_{th}$, VDD, VPP, $V_{SW}$ and VSS.

Herein, $V_{th}$ refers to the threshold voltage of a circuit component in a given semiconductor technology. The threshold voltage may be inherent to the circuit component, e.g. a field-effect transistor (FET). For example, the threshold voltage $V_{th}$ of a FET is the minimum gate-to-source voltage that is needed to create a conducting path between source and drain of the FET. As example, multiple circuit components of the same type within the circuit (or within a functional group of the circuit) may be substantially identical in their threshold voltage. In this case, the threshold voltage may be indicated for a single circuit component of the circuit (or functional group), and may be understood as applying also to other circuit components of the same type (if present) in the circuit (or functional group).

Herein, VDD refers to a supply voltage (also referred to as low level supply voltage) in the given semiconductor technology, e.g. as supplied to the circuit. For example, VDD may be in the range between about 2 volt and 5 volts. VDD may be provided by a power source connected to an input of the respective circuit.

Among others, VSS refers to a base voltage in the given semiconductor technology. As example, VSS may be ground, but however, may also differ from ground. Optionally, one or more other base voltages may be used in the given semiconductor technology, e.g. differing from VSS. For a facilitated understanding, the value of VSS is normalized herein to be zero. Reference made herein to various voltages use VSS as reference. In this metric, VDD may be positive, that is VDD>VSS. For example, the indication of VDD=3.3 volts may be understood as corresponding to VDD−VSS=3.3 volts, e.g. regardless of whether VSS is equal to ground, zero or another value. Said differently, VSS refers to the reference voltage. For a facilitated understanding, a voltage differing from VSS (e.g. by VDD or more) is represented by the value 1 (or the state "high"); and a voltage being equal to VSS is represented by the value 0 (or the state "low").

Herein, VPP refers to another supply voltage (also referred to as programming voltage or as high level supply voltage) in the given semiconductor technology, e.g. as supplied to the circuit, e.g., as applied to the capacitive memory structure for a programming operation or erasing operation. For example, VPP>VDD. For example, VPP may be above 5 volts. For example, VPP may be equal to or above a switching voltage (also referred to as write voltage) of the capacitive memory structure, e.g., its polarizable material. VPP may be provided by a power source connected to an input of the respective circuit. The switching voltage may be the minimum voltage that is capable to change the polarization state of the capacitive memory structure (also referred to as switching operation), e.g., its polarizable material. For example, the switching voltage $V_{SW}$ may be an intrinsic parameter of the capacitive memory structure, e.g., its polarizable material. For example, a programming operation or an erasing operation applied to a memory element may include to apply VPP to the memory element, e.g., to its capacitive memory structure. For example, the programming operation and/or the erasing operation may include a switching operation.

Reference is made herein to one or more control circuits. A control circuit may be configured to provide one or more voltages, one or more signals, and the like. For example, the control circuit may be configured to operate one or more switches of the memory cell, control the switching operation of the memory cell, control a read-out operation, a programming operation and/or an erasing operation, and/or control one or more voltages (e.g., their actual value and/or their time dependence) applied to or within the memory cell. Herein, various control circuits are detailed, e.g., gate-control circuit, bulk-control circuit, and/or drain-control circuit.

According to various aspects, controlling a voltage may include generating and/or outputting the voltage. According to other various aspects, controlling a voltage may include to influence the voltage via one or more controllable circuit elements. Examples of the one or more controllable circuit elements may include: one or more controllable switches (e.g., transistors), one or more controllable cascodes (also referred to as cascode circuits), one or more amplifies, one or more level switchers, and the like.

It may be understood, that one or more control circuits may be implemented separately from each other, e.g., by individual control circuits. According to various aspects, two or more control circuits, e.g., two or more of the gate-control circuit, bulk-control circuit, and/or drain-control circuit, may be implemented by a common circuit, e.g., sharing one or more circuit elements with each other.

A cascode circuit (not to be confused with a cascade) may include several electrical switches, which share the electrical load, e.g. several transistors or the like. The cascode circuit may be controlled by one or more switches (also called active cascode circuit). The active cascode circuit may include an additional auxiliary voltage (e.g., VBN or VBP) above the threshold voltage to control the one or more switches. For example, a cascode may be implemented by a two-stage amplifier that includes of a common-emitter stage feeding into a common-base stage. For example, a cascode may be implemented by multiple serially coupled transistors.

According to various aspects, each memory element may be provided within one common p-well. For example, each field-effect transistor structure (e.g., FeFETs) of each memory element of the memory cell may be provided within one common p-well.

Herein, reference will be made to an inverter circuit as exemplarily implementation of a not-gate circuit (also referred to as not-gate), for demonstrative purposes, and is not intended to be limiting. The references made, e.g., to specific circuit implementations including an inverter circuit, may analogously apply to circuit implementations including another not-gate circuit.

Herein, reference will be made to pairs of cross-coupled transistors as exemplarily implementation of a latch structure (e.g., providing for a flip-flop), for demonstrative purposes, and is not intended to be limiting. The references made, e.g., to specific circuit implementations including a pair of cross-coupled transistors, may analogously apply to circuit implementations including another latch structure, e.g., including a single pair of cross-coupled inverting circuit elements, such as bipolar transistors, field effect transistors, inverters, and the like.

Generally, VLSI (very-large-scale integration) chips conventionally require a small amount of configuration data. Either, their configuration is lost with every power-down or they are hard programmed with OTP (one-time-programmable). According to various aspects, it was recognized that aspects described herein (e.g., the memory cell) would overcome these limitations and furthermore open possibilities for future applications, such as non-volatile processors.

According to various aspects, the memory cell may be configured to store binary data in a non-volatile manner (also referred to as non-volatile memory cell). In some aspects, a dedicated voltage sequence is used to drive the memory cell 400. In some aspects, the memory cell 400 includes one or more level shifter circuits, e.g., modified to meet the control schema of the memory cell.

Generally, the memory cell may be implemented by one or more n- and p-type FeFETs.

FIG. 1 shows a schematic functioning of a field-effect transistor structure 100, according to various aspects. The field-effect transistor structure 100 may include a gate structure 108 (e.g., including one or more gate layers), wherein the gate structure 108 may include a gate isolation 104 (e.g., including one or more isolation layers) and a gate electrode 106 (e.g., including one or more electrode layers). The gate structure 108 is illustrated exemplarily as a planar gate stack, however, it may be understood that the planar configuration shown in FIG. 1 is an example, and other field-effect transistor designs may include a gate structure 108 with a non-planar shape, for example a trench gate transistor design, a vertical field-effect transistor design, or other designs as exemplarily shown in FIG. 3D and FIG. 3E, as examples. The gate structure 108 may define (e.g., be adjacent to) a channel region 102, e.g., provided in a semiconductor region (e.g., in a semiconductor layer, in a semiconductor die, etc.). The gate structure 108 may allow for a control of an electrical behavior (e.g., resistance) of the channel region 102. The gate structure 108 may, for example, be used to control (e.g., allow or prevent) a current flow in the channel region 102. In some aspects, the gate structure 108 may, for example, allow to control (e.g., allow or prevent) a source/drain current, $I_{SD}$, from a first source/drain region of the field-effect transistor structure 100 to a second source/drain region of the field-effect transistor structure 100. The source/drain regions are provided in or adjacent to the channel but are not shown in FIG. 1 (see also source/drain regions 200c in FIG. 5). The channel region 102 and the source/drain regions may be formed, e.g., via doping one or more semiconductor materials or by the use of intrinsically doped semiconductor materials, within a layer and/or over a layer. In some aspects, the gate structure 108 may control (e.g., increase or reduce) an electrical resistance, R, of the channel region 102 and, accordingly, control the amount of current that may flow through the channel region 102. With respect to the operation of the field-effect transistor structure 100, a voltage (illustratively an electrical potential) may be provided at (e.g., supplied to) the gate electrode 106 to control the current flow, $I_{SD}$, in the channel region 102, the current flow, $I_{SD}$, in the channel region 102 being caused by voltages supplied via the source/drain regions.

The gate electrode 106 may include an electrically conductive material, for example, polysilicon, a metal (e.g., aluminum), etc. In some aspects, the gate electrode 106 may include any suitable electrically conductive material, e.g., a metal, a metal alloy, a degenerate semiconductor (in other words a semiconductor material having such a high level of doping that the material acts like a metal and not anymore semiconducting). According to various aspects, the gate electrode 106 may include one or more electrically conductive portions, layers, etc. The gate electrode 106 may include, for example, one or more metal layers (also referred to as a metal gate), one or more polysilicon layers (also referred to as poly-Si-gate), etc. A metal gate may include, for example, at least one work-function adaption metal layer disposed over the gate isolation 104 and an additional metal layer disposed over the work-function adaption metal layer. A poly-Si-gate may be, for example, p-type doped or n-type doped.

According to various aspects, the gate isolation 104 may be configured to provide an electrical separation of the gate electrode 106 from the channel region 102 and further to influence the channel region 102 via an electric field generated by the gate electrode 106. The gate isolation 104 may include one or more electrically insulating portions, layers, etc., as described in more detail below.

Some examples of the gate isolation 104 may include at least two (e.g., two or more) layers (also referred to as gate isolation layers) differing in their material from each other. The at least two gate isolation layers may include, for example, a first gate isolation layer 104-1 (e.g., a first dielectric layer including a first dielectric material) and a second gate isolation layer 104-2 (e.g., a second dielectric layer including a second dielectric material distinct from first dielectric material). The second gate isolation layer 104-2 may be disposed over the first gate isolation layer 104-1. Illustratively, the first gate isolation layer 104-1 may be disposed closer to the channel region 102 of the field-effect transistor structure 100 with respect to the second gate isolation layer 104-2. The first gate isolation layer 104-1 may be disposed directly on the channel region 102 and may provide an interface for forming the second gate isolation layer 104-2. In some aspects, the first gate isolation layer 104-1 may be referred to as buffer layer.

As illustrated by the circuit equivalent 150 in FIG. 1, a first capacitance, $C_{FET}$, may be associated with the field-effect transistor structure 100 (according to various aspects, also referred to as capacitance of the field-effect transistor structure). Illustratively, the channel region 102, the gate isolation 104, and the gate electrode 106 may provide the first capacitance, $C_{FET}$, associated therewith, originating from the more or less conductive regions (the channel region 102 and the gate electrode 106) separated from one another by the gate isolation 104. Regarding the first capacitance, $C_{FET}$, illustratively, the channel region 102 may be considered as a first capacitor electrode, the gate electrode 106 as a second capacitor electrode, and the gate isolation 104 as a dielectric medium disposed between the first and second capacitor electrodes. The first capacitance, $C_{FET}$, of the field-effect transistor structure 100 may define one or more operating properties of the field-effect transistor structure 100. The configuration of the field-effect transistor structure 100 (e.g., of the gate isolation 104) may be adapted according to a desired behavior or application of the field-effect transistor structure 100 during operation (e.g., according to a desired capacitance), as described in further detail below.

In general, the capacitance, C, of a planar capacitor structure may be expressed by the following relation:

$$C = \varepsilon_0 \varepsilon_r \frac{A}{d},$$

with $\varepsilon_0$ being the relative permittivity of the vacuum, A being the effective area of the capacitor, d being the distance of the two capacitor electrodes from one another, and $\varepsilon_r$ being the relative permittivity of the dielectric material disposed between two capacitor electrodes assuming that the whole gap between the two capacitor electrodes is filled with the dielectric material. It is noted that the capacitance of a non-planar capacitor structure or of a modified variant of a planar capacitor structure may be calculated based on equations known in the art.

According to various embodiments, a memory cell element (also referred to as memory cell storage element) may be provided, for example, by coupling the gate structure 108 of the field-effect transistor structure 100 with a capacitive memory structure, or by integrating a memory structure in the gate structure 108 of the field-effect transistor structure (as shown, for example, in FIG. 2 and FIG. 3A to FIG. 3E).

The influence of the capacitance of a field-effect transistor structure on the performance of a memory cell element including a capacitive memory structure are described in further detail below.

Figure 2:
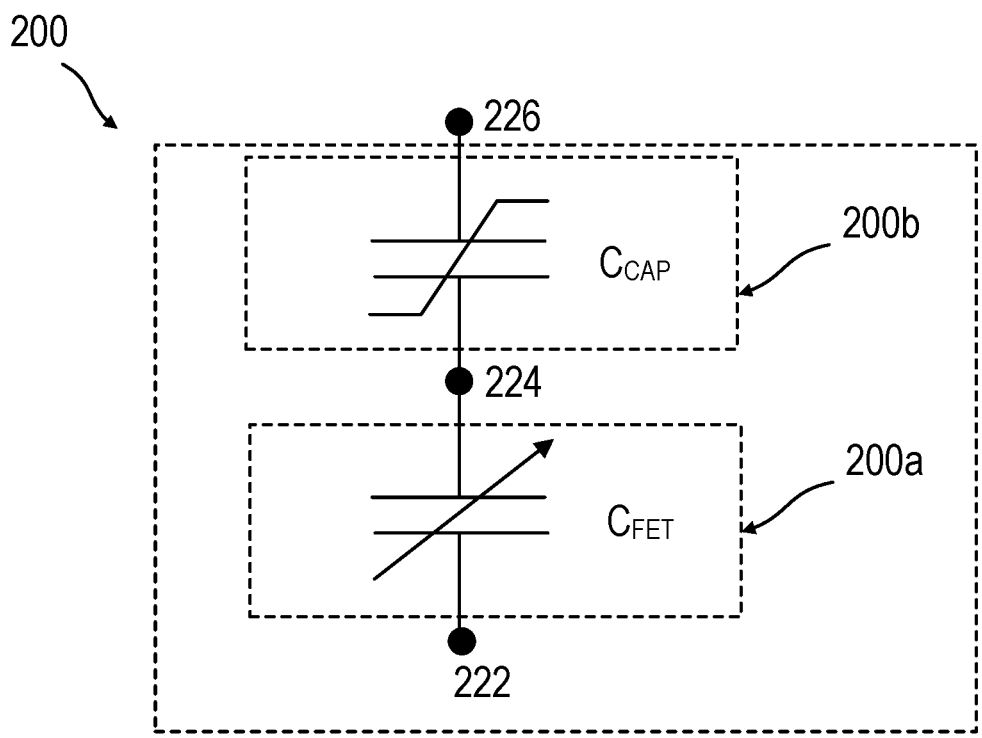
FIG. 2 shows schematically an equivalent circuit diagram of a memory element including a field-effect transistor structure and a capacitive memory structure, according to various aspects.

FIG. 2 shows a circuit equivalent of a memory cell member 200 (also referred to as memory element or as storage element) including a field-effect transistor structure 200a (e.g., configured as described here with reference to the field-effect transistor structure 100) and a capacitive memory structure 200b, according to various aspects. The field-effect transistor (FET) structure 200a may have a first capacitance, $C_{FET}$, associated therewith and the capacitive memory structure 200b may have a second capacitance, $C_{CAP}$, associated therewith. The field-effect transistor structure 200a and the capacitive memory structure 200b may be coupled (e.g., electrically connected) to one another such that a capacitive voltage divider is provided. The channel or bulk node of the field-effect transistor structure 200a may provide or may be connected to a first node 222 (according to various aspects, provided as or also referred to as terminal 222), an electrode of the capacitive memory structure 200b may provide or may be connected to a second node 226 (according to various aspects, provided as or also referred to as terminal 226) and an intermediate conductive portion (e.g., electrode, layer, etc.) may provide or may be connected to a floating intermediate node 224. Exemplary realizations of such connected structures will be described in further detail below, for example in relation to FIG. 3A to FIG. 3E.

The capacitive voltage divider formed by the field-effect transistor structure 200a and the capacitive memory structure 200b may allow adapting the capacitances $C_{FET}$, $C_{CAP}$ of the respective capacitors to allow an efficient programming of the capacitive memory structure 200b. The overall gate voltage required for switching the memory cell member 200 from one memory state into another memory state (e.g. from high threshold voltage state to low threshold voltage state, as described below), may become smaller in case the voltage distribution across the field-effect transistor structure 200a and the capacitive memory structure 200b is adapted such that more of the applied gate voltage drops across the functional layer of the capacitive memory structure 200b (e.g., across a remanent-polarizable layer, such as a ferroelectric layer) than across the gate isolation of the field-effect transistor structure 200a. The overall write voltage (illustratively, applied via the nodes 222, 226 to which the field-effect transistor structure 200a and the capacitive memory structure 200b are connected) may thus be reduced by adapting the capacitive voltage divider. The voltage distribution may be determined by voltage divider calculations for a series connection of the capacitors.

That is, in case the capacitance, $C_{FET}$, of the field-effect transistor structure 200a is adapted (e.g., by providing a suitable gate isolation) a predefined fraction of the voltage applied to the series connection may drop across the capacitive memory structure 200b. Accordingly, the electric field generated across the gate isolation of the field-effect transistor structure 200a underneath the capacitive memory structure 200b could be reduced, if desired. This may lead to a reduced interfacial field stress, which may lead to a reduced wear out of the interface due to, for example, charge injection. Therefore, the reduced electric field generated across the gate isolation may lead to improved endurance characteristics of the memory cell member 200, that is, to an increased amount of possible polarization reversals until the memory cell member 200 may lose or change its memory properties.

In some aspects, the functional layer of the capacitive memory structure 200b may be a remanent-polarizable layer. By increasing the capacitance $C_{FET}$ of the field-effect transistor structure 200a (e.g., by providing a gate isolation including a relatively thick layer of material with high dielectric constant), the depolarization field, $E_{Dep}$, of the remanent-polarizable layer may be reduced. The depolarization field may be expressed by the following set of equations, wherein the indices "FET" refer to the field-effect transistor structure 200a (also referred to as transistor structure capacitor) and the indices "CAP" refer to the capacitive memory structure 200b (also referred to as memory structure capacitor), as described herein:

$$V_{FET} + V_{CAP} = 0,$$

$$D = \varepsilon_0 \varepsilon_{FET} E_{FET} = \varepsilon_0 \varepsilon_{CAP} E_{CAP} + P,$$

$$E_{CAP} \equiv E_{Dep} = -P\left(\varepsilon_0 \varepsilon_{CAP}\left(\frac{C_{FET}}{C_{CAP}} + 1\right)\right)^{-1}.$$

The depolarization field $E_{Dep}$ may be detrimental to data retention since, depending on its magnitude, it may depolarize the remanent-polarizable layer. However, the magnitude may be reduced by increasing the capacitance ratio $C_{FET}/C_{CAP}$. Accordingly, in case the capacitance $C_{FET}$ of the field-effect transistor structure 200a is increased, the depolarization field is reduced. This in turn improves the data retention of the memory cell member 200.

In a first approximation, the voltage which drops across the memory structure capacitor, $V_{CAP}$, may be estimated by:

$$V_{CAP} = V_{226} \cdot \frac{C_{FET}}{C_{FET} + C_{CAP}},$$

wherein $V_{226}$ represents the voltage applied to the top node 226 (e.g., to a top electrode of the capacitive memory structure 200b, for example assuming that the node 222 associated with the bulk of the field-effect transistor structure 200a is connected to a base potential, e.g. to ground or 0 V) and the capacitances in general are defined as described above. Suitable parameters for influencing the voltage drop across the capacitive memory structure 200b (e.g., across the ferroelectric capacitor) may be represented by the area ratio between the capacitive memory structure 200b and the field-effect transistor structure 200a, and/or by the relative permittivity of the field-effect transistor structure 200a (e.g., of the gate isolation of the field-effect transistor structure 200a). In some aspects, adapting the capacitance $C_{FET}$ of the field-effect transistor structure 200a to adjust the gate voltage divider may allow keeping the thickness of the functional layer (e.g., the memory layer, e.g., a remanent-polarizable layer, e.g., a spontaneously-polarizable layer) of the capacitive memory structure 200b in a predefined range.

FIG. 3A to FIG. 3E illustrate schematically exemplarily implementations 300a, 300b, 300c, 300d, 300e of the memory cell member 200, according to various aspects. These memory cell members 300a, 300b, 300c, 300d, 300e may be configured such that a field-effect transistor structure 302a and a capacitive memory structure 302b of the respective memory cell member 300a, 300b, 300c, 300d, 300e are connected to form a capacitive voltage divider $C_{FET}/C_{CAP}$, as described with reference to the memory cell member 200 in FIG. 2. Each of the described memory cell members 300a, 300b, 300c, 300d, 300e may include a field-effect transistor structure 302a including a channel 304 (also referred to herein as channel region 304), a gate isolation 306, and a gate electrode 308. The channel 304, the gate isolation 306, and the gate electrode 308 may be configured as described above, e.g., with reference to channel 102, the gate isolation 104, and the gate electrode 106 of field-effect transistor structure 100. In some aspects, the gate isolation 306 may include a first gate isolation layer 306a and/or a second gate isolation layer 306b. In some aspects, the gate isolation 306 may include (e.g., be made of) a single gate isolation layer, i.e. one of the two gate isolation layers 306a, 306b may be omitted. The gate isolation 306 may extend from the channel region 304 to the gate electrode 308.

In some aspects, the first gate isolation layer 306a may be in direct physical contact with the channel region 304. The second gate isolation layer 306b may be in direct physical contact with the first gate isolation layer 306a and with the gate electrode 308 of the field-effect transistor structure 302a.

Each of the described memory cell members 300a, 300b, 300c, 300d, 300e may include a capacitive memory structure 302b electrically connected (in other words, electrically coupled) with the field-effect transistor structure 302a. The capacitive memory structure 302b may include any type of planar or non-planar design with at least a first electrode 322, a second electrode 326 and at least one memory structure 324 disposed between the first electrode 322 and the second electrode 326, e.g. to provide memory functions. The memory structure 324 may be or may include one or more memory layers, e.g., one or more remanent-polarizable layers. However, the memory structure 324 may include other implementations of memory materials or memory structures, e.g., an anti-ferroelectric layer coupled (e.g., disposed directly on) to a charge storage layer. The charge storage layer may include any material suitable to store charge (e.g., by trapping).

Figure 3A:
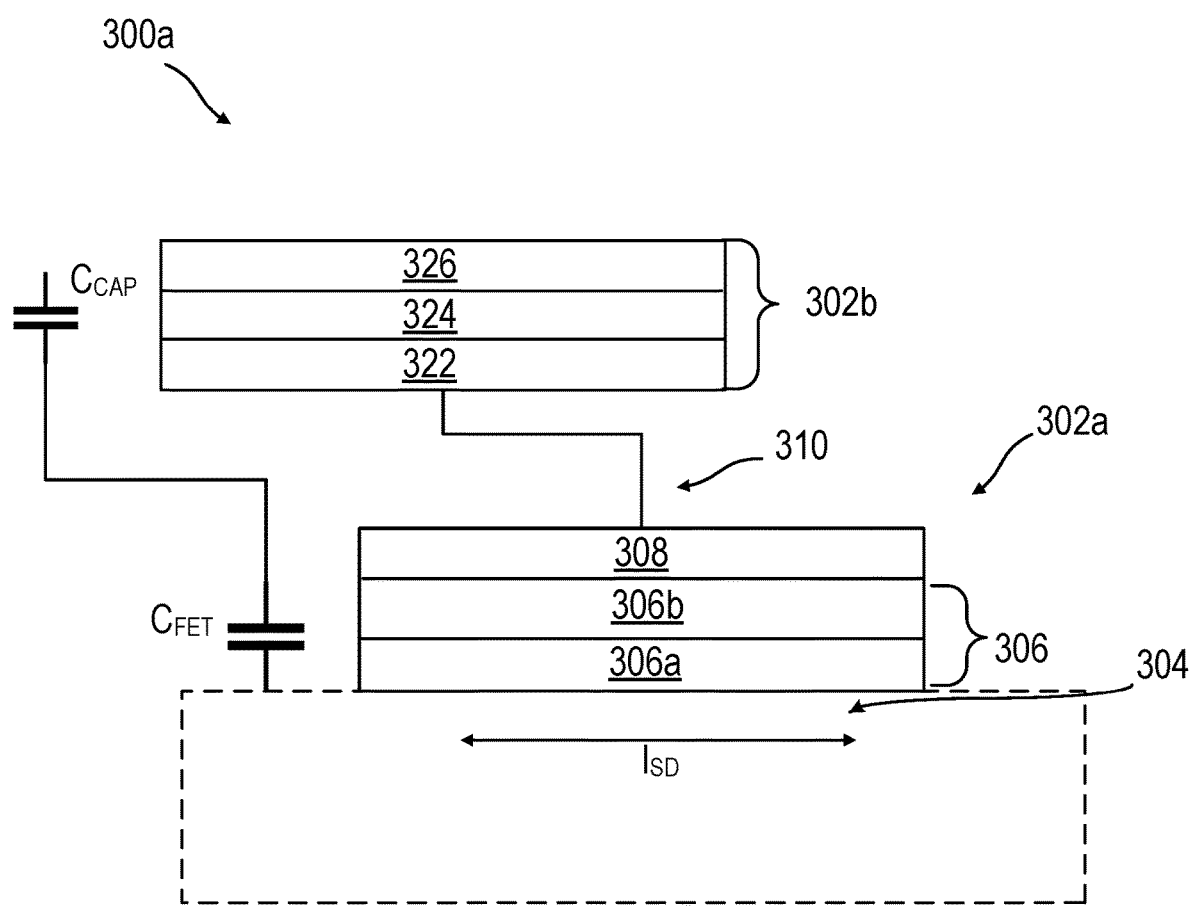
FIG. 3A to FIG. 3E each shows schematically a memory element including a field-effect transistor structure and a capacitive memory structure, according to various aspects.

As described above with reference to the memory cell member 200 in FIG. 2, the field-effect transistor structure 302a and the capacitive memory structure 302b may be connected to form a capacitive voltage divider $C_{FET}/C_{CAP}$, e.g., by connecting one of the electrodes of the capacitive memory structure 302b (e.g., the first electrode 322) with the gate electrode 308 of the field-effect transistor structure 302a, as shown for example in FIG. 3A. The electrically conductive connection of the capacitive memory structure 302b with the field-effect transistor structure 302a (e.g., of the first electrode 322 with the gate electrode 308) may provide a series capacitive connection between the capacitors formed by the capacitive memory structure 302b and the field-effect transistor structure 302a. In a planar configuration, the first electrode 322 of the capacitive memory structure 302b may be a first capacitor electrode, the second electrode 326 may be a second capacitor electrode, and the at least one memory structure 324 may be a dielectric medium between the first electrode and the second capacitor electrode.

In some aspects, the gate electrode 308 of the field-effect transistor structure 302a may be electrically conductively connected to the first electrode 322 of the capacitive memory structure 302b via an electrically conductive (e.g., ohmic) connection 310, as shown in FIG. 3A. In some aspects, the first electrode 322 of the capacitive memory structure 302b may be in direct physical contact with the gate electrode 308 of the field-effect transistor structure 302a.

Figure 3B:
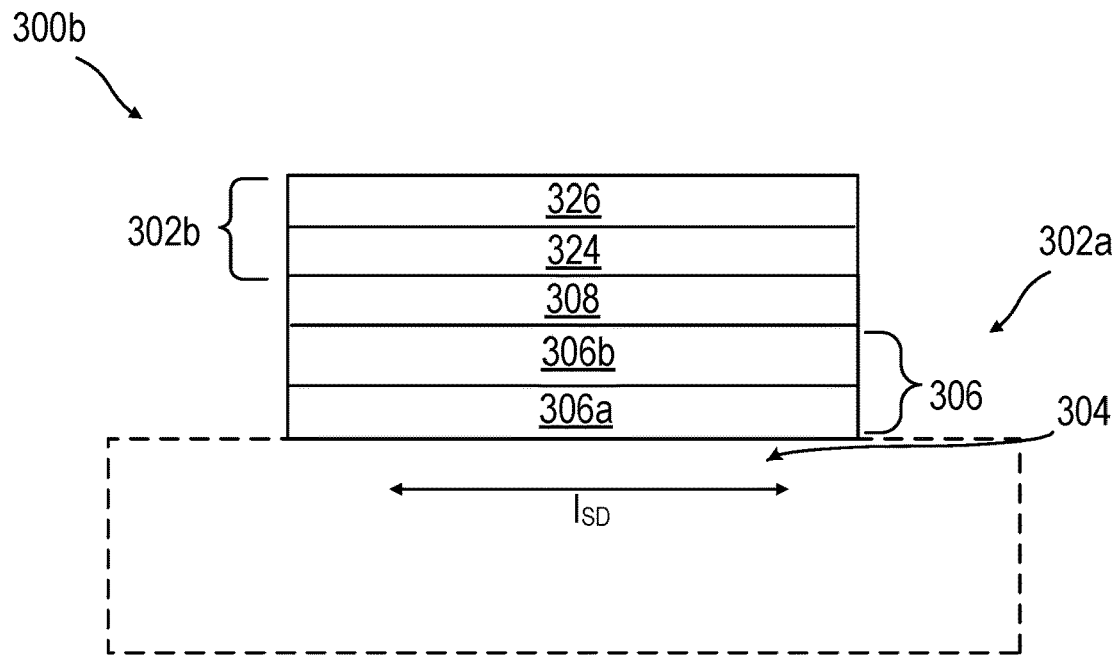

In some aspects, the capacitive memory structure 302b and the field-effect transistor structure 302a may share a common electrode acting as gate electrode of the field-effect transistor structure 302a and as electrode of the capacitive memory structure 302b, as shown in FIG. 3B.

Figure 3C:
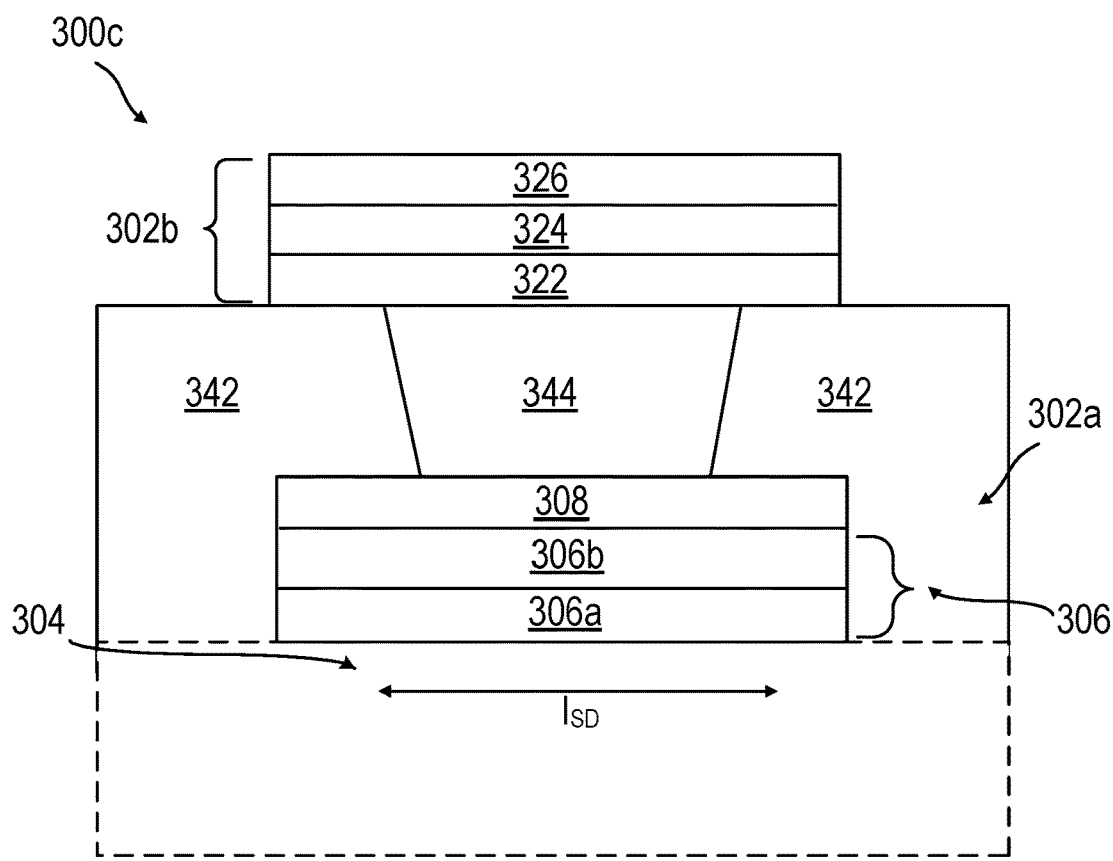

In some aspects, the electrically conductive (e.g., ohmic) connection 310 between the field-effect transistor structure 302a and the capacitive memory structure 302b may be provided by one or more metallization structures disposed over the field-effect transistor structure 302a, as shown in FIG. 3C.

The at least one memory structure 324 may include any type of remanent-polarizable and/or spontaneously-polarizable material, e.g., a ferroelectric material, an anti-ferroelectric material, an anti-ferroelectric-like material, etc. The at least one memory structure 324 may be the functional layer of the capacitive memory structure 302b to store, for example, an information via at least two remanent polarization states of the at least one memory structure 324. The programming of the capacitive memory structure 302b (illustratively the storage of information therein) may be carried out by providing an electric field between the first electrode 322 and the second electrode 326 (e.g., an electric potential difference between a first node and a second node associated with the first electrode 322 and the second electrode 326, respectively, as described in relation to FIG. 2) to thereby set or change the remanent polarization state of the at least one memory structure 324. As an example, a voltage may be provided between the top electrode 326 and the bulk region of the field-effect transistor structure 302a.

It is understood that a memory structure 324 is only an example of a possible functional layer of the capacitive memory structure 302b, and any other functional layer whose state may be altered by an electric field provided across the capacitive memory structure 302b may be used. In some aspects, a material of the memory structure 324 may include hafnium and/or zirconium.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

According to various aspects, a ferroelectric material may be used as part of a capacitive memory structure of a memory cell member (e.g., as part of the capacitive memory structure 302b of a memory cell member 300a, 300b, 300c, 300d, 300e, e.g., of the capacitive memory structure 200b of the memory cell member 200). A ferroelectric material may be an example of material of a remanent-polarizable layer (e.g., of the memory structure 324). Illustratively, ferroelectric materials may be used to store data in non-volatile manner in integrated circuits. The term "ferroelectric" may be used herein, for example, to describe a material that shows a hysteretic charge voltage relationship (Q-V). The ferroelectric material may be or may include at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g. but not limited to it a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example.

According to various aspects, a memory cell member (e.g., a memory cell member 200, 300a, 300b, 300c, 300d, 300e), may have at least two distinct states associated therewith, for example with two distinct electrical conductivities or two distinct amounts of stored charge that may be determined to determine in which of the at least two distinct states the memory cell member is residing in. According to various aspects, a memory state the memory cell member is residing may be a "programmed state" or an "erased state." As an example, the programmed state may be an electrically conducting state or a state with positive stored charge (e.g. associated with a logic "1") and the erased state may be an electrically non-conducting state or a state with negative stored charge (e.g., associated with a logic "0"). However, the definition of programmed state and erased state may be selected arbitrarily.

According to various aspects, the residual polarization of the remanent-polarizable layer may define the memory state a memory cell member is residing in. The polarization state of the remanent-polarizable layer may be switched by means of the capacitive memory structure. The polarization state of the remanent-polarizable layer may also be read-out by means of the capacitive memory structure. According to various aspects, a memory cell member may reside in a first memory state in the case that the remanent-polarizable layer is in a first polarization state, and the memory cell member may reside in a second memory state in the case that the remanent-polarizable layer is in a second polarization state (e.g., opposite to the first polarization state). As an example, the polarization state of the remanent-polarizable layer may determine the amount of charge stored in the capacitive memory structure. The amount of charge stored in the capacitive memory structure may be used to define a memory state of the memory cell member. The threshold voltage of a field-effect transistor structure (e.g., the field-effect transistor structure 200a, the field-effect transistor structure 302a) may be a function of the amount and/or polarity of charge stored in the capacitive memory structure, e.g. on the polarization state of the remanent-polarizable layer. A first threshold voltage, e.g. a high threshold voltage, $V_{th}^H$, may be associated with the first polarization state (e.g., with the first amount and/or polarity of stored charge), and a second threshold voltage, e.g. a low threshold voltage, $V_{th}^L$, may be associated with the second polarization state (e.g., with the second amount and/or polarity of stored charge). Illustratively, the first memory state may be associated with the first threshold voltage, and the second memory state may be associated with the second threshold voltage.

According to various aspects, the second gate isolation layer 306b of the gate isolation 306 of the field-effect transistor structure 302a may be a layer different from a functional layer of the capacitive memory structure 302b (e.g., different from the memory structure 324), e.g. different in at least one of the type of material(s) or the remanent-polarizable properties of the material(s). By way of example, the material of the second gate isolation layer 306b may not possess remanent-polarizable properties, e.g. it may not possess ferroelectric properties.

According to various aspects, the semiconductor portion (illustratively, where the channel region 304 may be formed), may be made of or may include silicon. However, other semiconductor materials of various types may be used in a similar way, e.g. germanium, Group III to V (e.g. SiC), or other types, including for example carbon nanotubes, organic materials (e.g., organic polymers), etc. In various aspects, the semiconductor portion may be a wafer made of silicon (e.g. p-type doped or n-type doped). In other aspects, the semiconductor portion may be a silicon on insulator (SOI) wafer. In other aspects, the semiconductor portion may be provided by a semiconductor structure, e.g., by one or more semiconductor fins, one or more semiconductor nanosheets, one or more semiconductor nanowires, etc., disposed at a carrier.

FIG. 3C shows an exemplary integration scheme for a memory cell member 300c in a schematic view, according to various aspects, in which a metallization structure is provided to electrically connect the field-effect transistor structure 302a to the capacitive memory structure 302b. It is understood that the metallization structure may include a plurality of metallization structures, e.g. a plurality of single- or multi-level contact structures.

The metallization structure may be configured to electrically conductively connect the gate electrode 308 of the field-effect transistor structure 302a and the first electrode 322 of the capacitive memory structure 302b with one another. As an example, the metallization structure may include a contact metallization. The contact metallization may be at least partially disposed between the field-effect transistor structure 302a and the capacitive memory structure 302b. As another example, the metallization structure may include a contact metallization and a single- or multi-level metallization disposed over the contact metallization. In this case, both the contact metallization and at least one level of the single- or multi-level metallization may be disposed between the field-effect transistor structure 302a and the capacitive memory structure 302b.

The metallization structure may include a gate contact structure 344 (also referred to as gate contact). The gate contact structure 344 may be embedded in (e.g., may be laterally surrounded by) an insulator layer 342. The insulator layer 342 may include a dielectric material, e.g., silicon oxide ($SiO_2$), silicon nitride ($SiN_x$), etc., having, for example, a thickness in the range from about 10 nm to about 100 nm, e.g., a thickness of 40 nm. In some aspects, the insulator layer 342 may include a plurality of insulator layers, e.g. each including a same material or different materials. The gate contact structure 344 may include at least one metal layer, e.g., including tungsten (W), cobalt (Co), etc. The gate contact structure 344 may be in direct physical contact with the gate electrode 308 of the field-effect transistor structure 302a. The gate contact structure 344 may be in direct physical contact with the first electrode 322 of the capacitive memory structure 302b. According to various aspects, the electrical connection between the first electrode 322 of the capacitive memory structure 302b and the gate electrode 308 of the field-effect transistor structure 302a may be formed by the gate contact structure 344.

A further metallization structure (shown, for example, in FIG. 3D and FIG. 3E) may be formed over the capacitive memory structure 302b. The further metallization structure may include a memory contact structure (also referred to as memory contact). The memory contact structure may be embedded in (e.g., may be laterally surrounded by) a further (e.g., second) insulator layer.

Figure 3D:
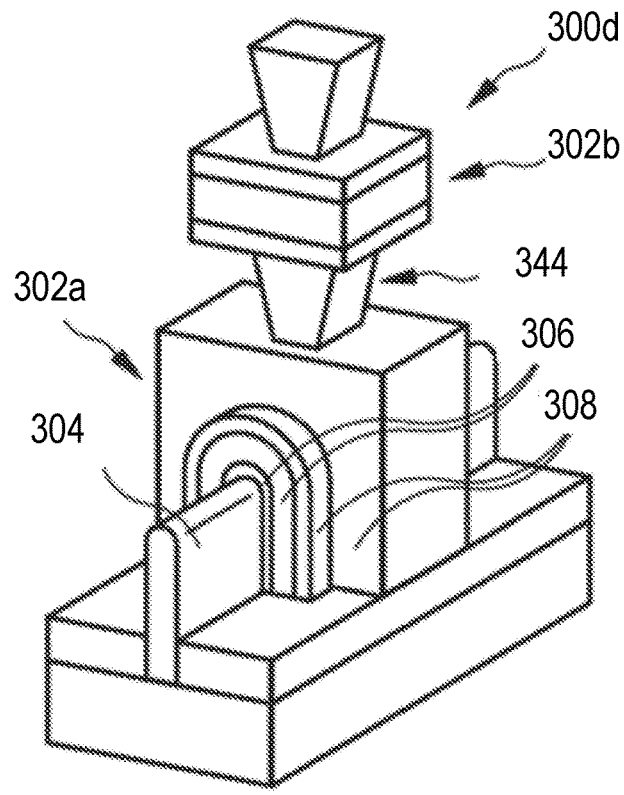
Figure 3E:
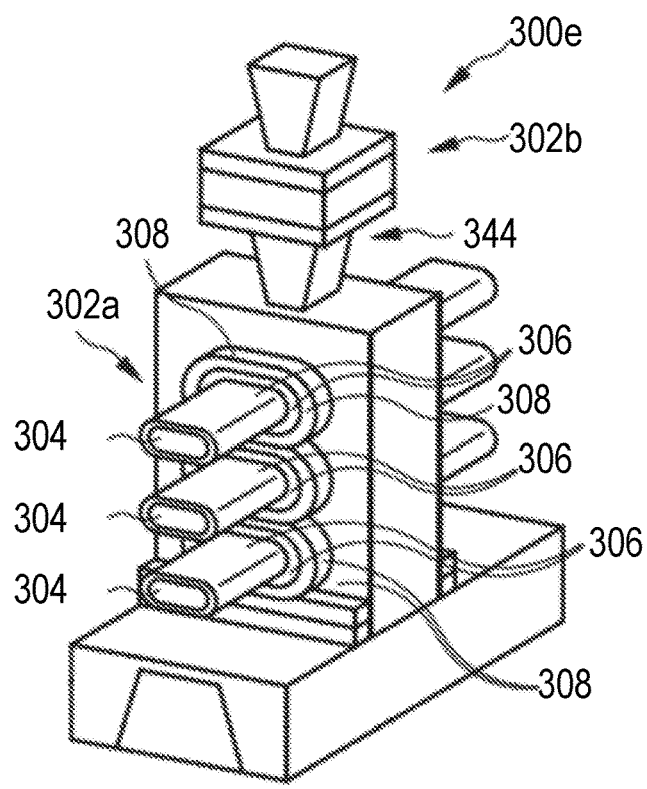

FIG. 3D and FIG. 3E illustrate exemplarily implementations of a memory cell member 300d, 300e having a non-planar architecture, e.g. for a field-effect transistor structure 302a (e.g., for a memory transistor described above).

In the integration scheme shown in FIG. 3D, at least the field-effect transistor structure 302a of the memory cell member 300d may be configured as a fin field-effect transistor (FinFET). The semiconductor portion in which the channel region 304 is provided may have the shape of a vertical fin, wherein the gate isolation 306 and the gate electrode 308 may at least partially surround the fin.

In the integration scheme shown in FIG. 3E, at least the field-effect transistor structure 302a of the memory cell member 300e may be configured as a nanosheet or nanowire field-effect transistor. The one or more semiconductor portions, in which a channel region 304 is provided, may each have the shape of a nanosheet or nanowire. The gate isolation 306 and the gate electrode 308 may at least partially surround the respective nanosheets or nanowires.

For ferroelectric $HfO_2$, its ferroelectric properties may likely disappear when the layer thickness is reduced to below 2 nm or at least when the reduction in film thickness leads to an unacceptable increase of the crystallization temperature such that the ferroelectric phase in $HfO_2$ cannot be stabilized anymore. Therefore, according to various aspects, a layer thickness for a ferroelectric $HfO_2$ layer used in a capacitive memory structure may be selected greater than or equal to 2 nm. For the most advanced transistor platforms, e.g., illustrated exemplarily in FIG. 3D and FIG. 3E, it may be beneficial to arrange the ferroelectric $HfO_2$ layer above the field-effect transistor structure, so that the ferroelectric $HfO_2$ layer can be implemented with the desired layer thickness in these process platforms.

Figure 4:
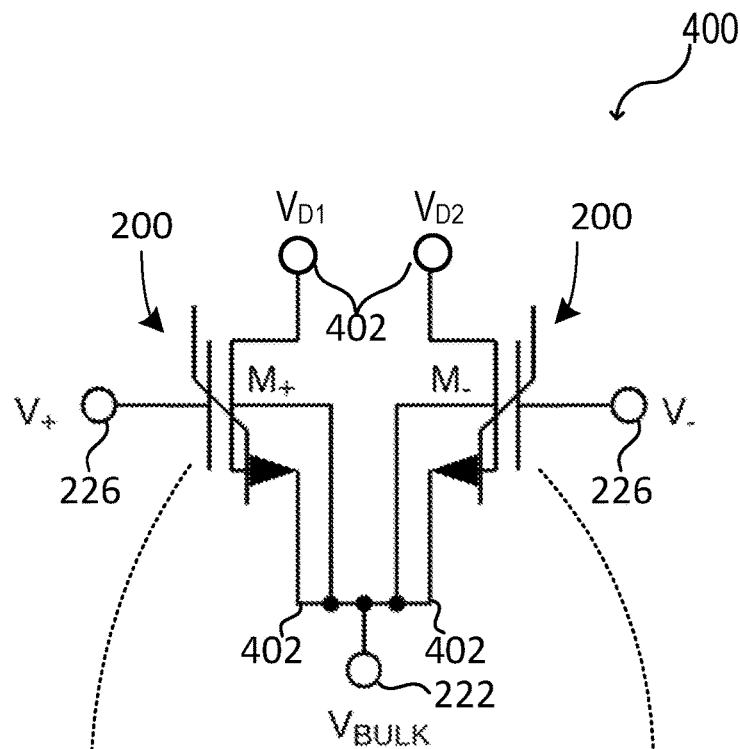
FIG. 4 shows schematically a memory cell including two memory elements, according to various aspects.

FIG. 4 illustrates a memory cell 400 in a schematic circuit diagram, in accordance with various aspects, including two memory cell members 200 (also referred to as storage pair), which are referred to as first memory cell member 200 (also referred to as first memory element, as M$_+$ or as FeFET1) and second memory cell member 200 (also referred to as second memory element, M$_-$ or as FeFET2).

Figure 5:
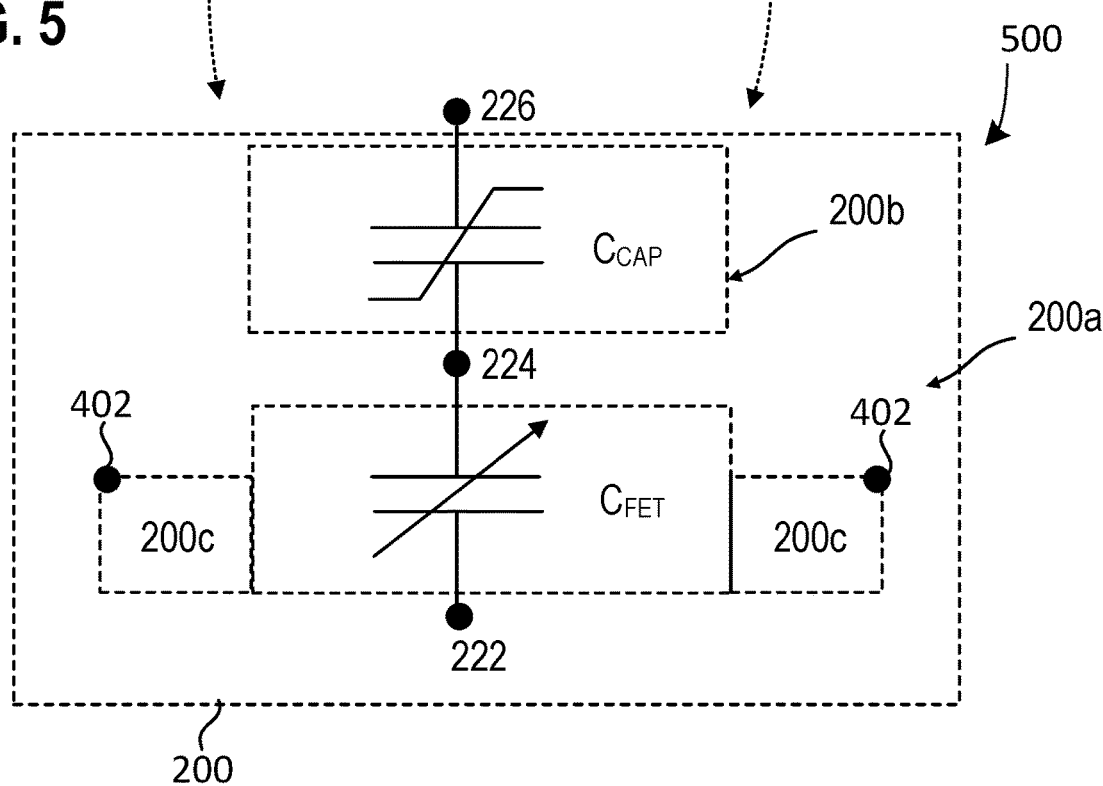
FIG. 5 shows an equivalent circuit diagram representing each of the two memory elements.

FIG. 5 illustrates an equivalent circuit diagram 500 representing each of the two memory cell members 200.

Each of the two memory cell members 200 may include a respective field-effect transistor structure 200a including the first capacitance, $C_{FET}$, and a capacitive memory structure 200b including the second capacitance, $C_{CAP}$. For example, each field-effect transistor structure 200a may include two source/drain regions 200c, which are also referred to as first and second source/drain regions 200c. The two source/drain regions 200c of each field-effect transistor structure 200a may be coupled to (e.g., being adjacent to) the channel region of the field-effect transistor structure 200a.

The memory cell 500 may be provided and/or operated as a five-terminal memory cell as detailed in the following.

The memory cell 500 includes a first terminal 226 (also referred to as first gate terminal 226 or as TG1) coupled to the capacitive memory structure 200b of the first memory cell member 200 (also referred to as first capacitive memory structure 200b). A voltage at the first gate terminal 226 may be also referred to as first gate voltage V$_+$.

The memory cell 500 includes a second terminal 226 (also referred to as second gate terminal 226 or as TG2) coupled to the capacitive memory structure 200b of the second memory cell member 200 (also referred to as second capacitive memory structure 200b). A voltage at the second gate terminal 226 may be also referred to as second gate voltage V$_-$.

The memory cell 500 includes further a third terminal 222 (also referred to as bulk terminal 222 or as TB) coupling the field-effect transistor structure 200a of the first memory cell member 200 (also referred to as first field-effect transistor structure 200a) with the field-effect transistor structure 200a of the second memory cell member 200 (also referred to as second field-effect transistor structure 200a). A voltage at the bulk terminal 222 may be also referred to as bulk voltage $V_{BULK}$ (also referred to as VS/B).

According to various aspects, the first capacitive memory structure 200b may capacitively couple the first gate terminal 226 with the first field-effect transistor structure 200a, e.g., its gate electrode. Additionally or alternatively, the second capacitive memory structure 200b may capacitively couple the second gate terminal 226 with the second field-effect transistor structure 200a, e.g., its gate electrode.

According to various aspects, each of the two field-effect transistors 200a, e.g., a first drain/source region 200c of the field-effect transistor 200a (e.g., a source region 200c), may be coupled to the bulk terminal 222. Additionally or alternatively, the two field-effect transistors 200a, e.g., their first drain/source regions 200c (e.g., source regions 200c), may be coupled with each other, e.g., by the bulk terminal 222.

The memory cell 500 includes further a fourth terminal 402 (also referred to as first drain/source terminal or as TD1) coupled to the first field-effect transistor 200a, e.g., its second drain/source region 200c (e.g., drain region 200c). The memory cell 500 includes further a fifth terminal 402 (also referred to as second drain/source terminal or as TD2) coupled to the second field-effect transistor 200a, e.g., its second drain/source region 200c (e.g., drain region 200c).

A voltage at the first drain/source terminal 402 may be also referred to as first drain/source voltage $V_{D1}$. A voltage at the second drain/source terminal 402 may be also referred to as second drain/source voltage $V_{D2}$.

Figure 6:
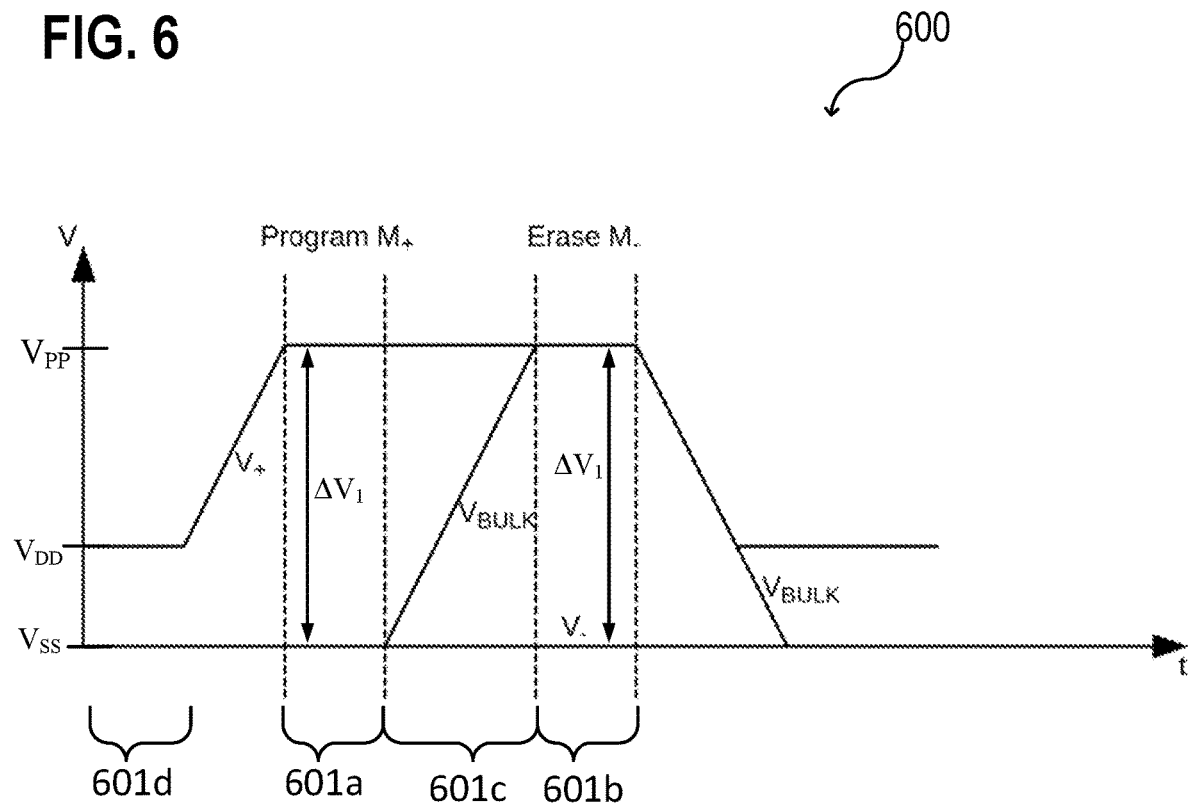
FIG. 6 shows a control schema for the memory cell in a schematic diagram according to various aspects.

FIG. 6 illustrates a control schema 600 for the memory cell 400 in a schematic diagram according to various aspects, the diagram illustrating the voltage value V over the time t. The control schema 600 may implement a writing operation (e.g. including a programming operation and an erasing operation). According to the control schema 600, the memory cell members 200 may be operated differentially as detailed in the following.

The control schema 600 includes a multiple phases. The multiple phases may include a first phase 601a and a second phase 601b.

In the first phase 601a (also referred to as programming phase 601a), the first gate voltage V$_+$ may differ from the bulk voltage $V_{BULK}$, e.g., by a first voltage difference value $\Delta V_1$. In the programming phase 601a, the first memory element 200 (M$_+$) may be programmed, e.g., to a first memory state representing a logic "1" or to a second memory state representing a logic "0". As example, in the first phase 601a, $\Delta V_1 = V_{PP}$, $V_+ = V_{PP}$, $V_- = V_{SS}$ and/or $V_{BULK} = V_{SS}$. However, other voltage values may be used. The actual memory state (e.g., "1" or "0"), the first memory element 200 (M$_+$) is switched to in the first phase 601a may be a function of a data signal, as detailed below.

In the second phase 601b (also referred to as erasing phase 601b), the second gate voltage V$_-$ may differ from the bulk voltage $V_{BULK}$, e.g., by the first voltage difference value $\Delta V_1$. In the erasing phase 601b, the second memory element 200 (M$_-$) may be erased, e.g., to a reference memory state. The reference memory state may be the first memory state or the second memory state. As example, in the second phase 601b, $\Delta V_1 = V_{PP}$, $V_+ = V_{PP}$, $V_- = V_{SS}$ and/or $V_{BULK} = V_{PP}$. However, other voltage values may be used. The actual memory state (e.g., "1" or "0"), the second memory element 200 (M$_-$) is switched to in the second phase 601b may be a function of the data signal, as detailed below.

Optionally, a difference of the first gate voltage V$_+$ from the second gate voltage V$_-$ may be a function of the actual phase of the control schema 600.

Optionally, the first gate voltage V$_+$ in the first phase 601a and the first gate voltage V$_+$ in the second phase 601b may be equal. Additionally or alternatively, the second gate voltage V$_-$ in the first phase 601a and the second gate voltage V$_-$ in the second phase 601b may be equal.

Optionally, the bulk voltage $V_{BULK}$ may be changed between the first phase 601a and the second phase 601b, e.g., by at least $\Delta V_1$. Illustratively, the schema implements the differential operation. For example, the multiple phases may include a third phase 601c, in which the bulk voltage $V_{BULK}$ is changed, e.g., relative to the first gate voltage V$_+$ and/or the second gate voltage V$_-$.

As result of the control schema 600, the memory cell 400 may be in the memory state of the first memory element 200 (M$_+$).

It may be understood that the control schema 600 detailed above applies the programming operation to the first memory element 200 (M$_+$) and the erasing operation to the second memory element 200 (M$_-$), which is also referred to as WE-control schema. In order to apply the erasing operation to the first memory element 200 (M$_+$) and the programming operation to the second memory element 200 (M$_-$), the values of first gate voltage V$_+$ and the second gate voltage V$_-$ may be mutually interchanged (also referred to as EW-control schema).

In continuous operation, a WE-control schema may be followed by an EW-control schema and an EW-control schema may be followed by a WE-control schema.

For switching between the writing operation and a read-out operation, one or more write signals may be provided as detailed later. The one or more write signals may be "high" (e.g., PRG may be VDD), in (throughout) the first phase 601a, the second phase 601b and/or the third phase 601c.

For example, the multiple phases may include a fourth phase 601d (also referred to as read-out phase 601d). The one or more write signals may be "low" (e.g., PRG may be VSS or 0 volt), in (throughout) the fourth phase 601d.

It may be understood, that various circuit architectures may be able to provide the control schema 600 or the respective differential operation. In the following, various exemplarily circuit architectures are detailed, which provide a control of the two memory cell members 200.

Figure 7:
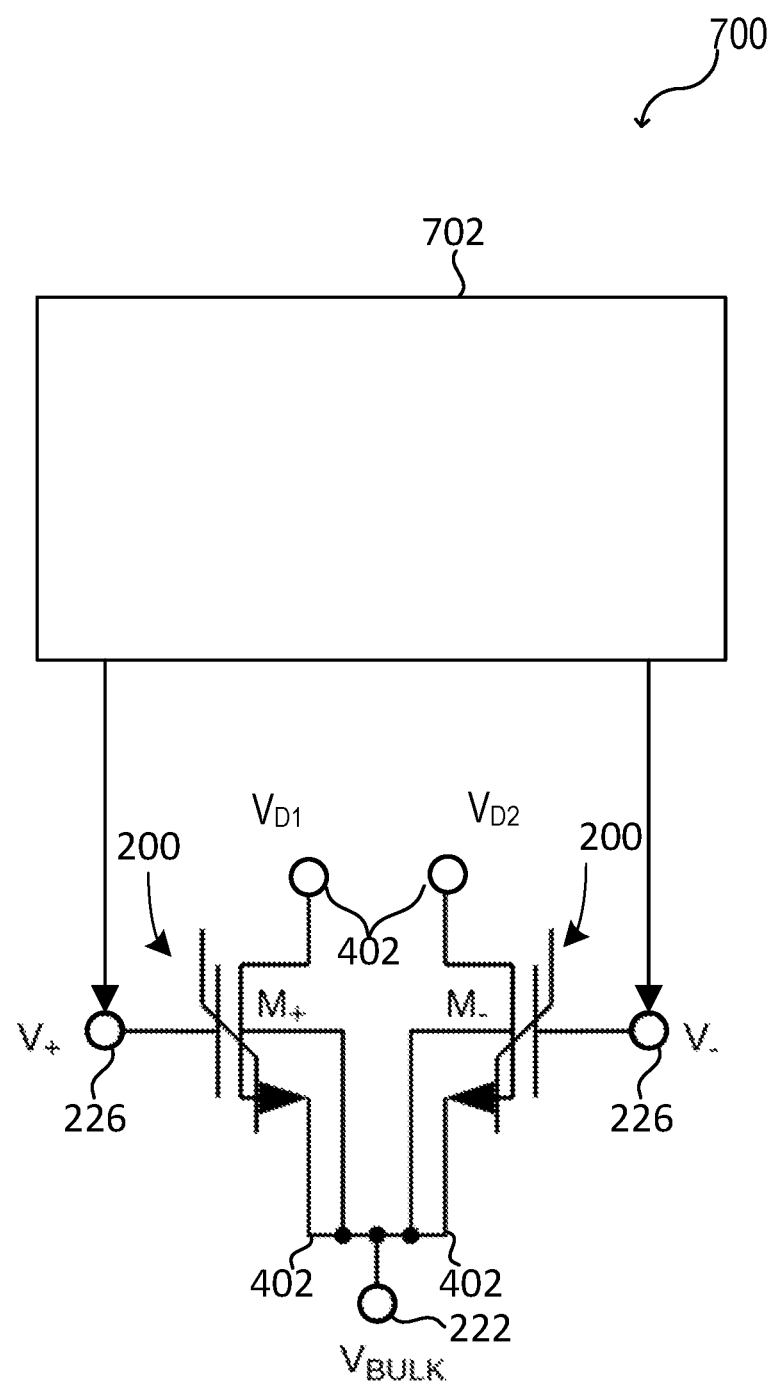
FIG. 7 to FIG. 11 respectively show a memory cell in a schematic view, in accordance with various aspects.

FIG. 7 illustrates a memory cell 400 in a schematic circuit diagram, in accordance with various aspects 700, including two memory cell members 200 and a first control circuit 702 (also referred to as gate-control circuit 702). The gate-control circuit 702 may be configured to control a first voltage (also referred to as first gate voltage $V_+$ or VG1) at the first gate terminal 226. The gate-control circuit 702 may be configured to control a second voltage (also referred to as second gate voltage $V_-$ or VG2) at the second gate terminal 226.

For example, the gate-control circuit 702 may be configured to control the first gate voltage $V_+$ and/or the second gate voltage $V_-$ according to the control schema 600.

Figure 8:
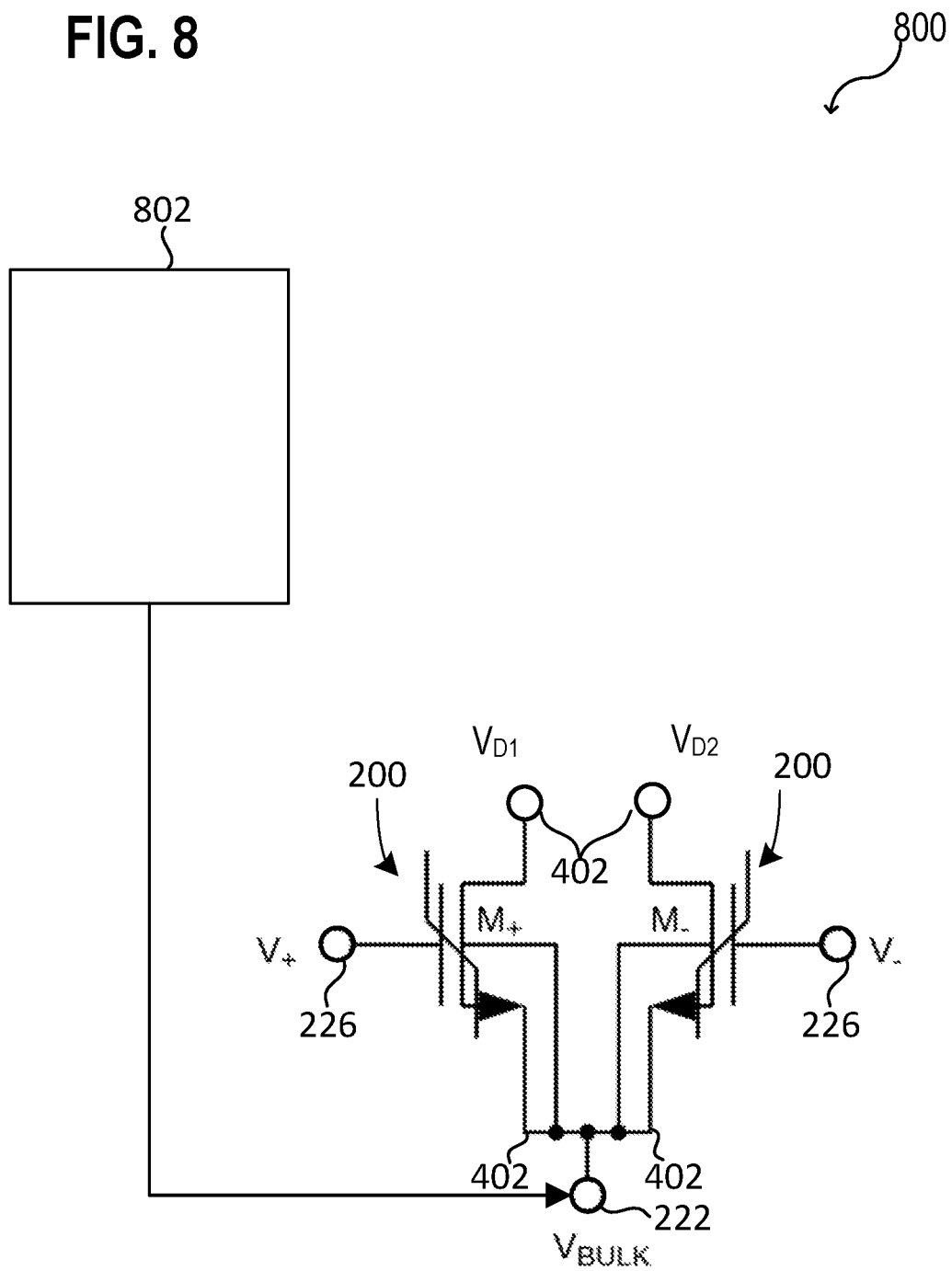

FIG. 8 illustrates a memory cell 400 in a schematic circuit diagram, in accordance with various aspects 800, including two memory cell members 200 and a second control circuit 802 (also referred to as bulk-control circuit 802). The bulk-control circuit 802 may be configured to control a third voltage (also referred to as bulk voltage $V_{BULK}$) at the bulk terminal 222. For example, the bulk-control circuit 802 may be configured to control the bulk voltage $V_{BULK}$ according to the control schema 600.

Figure 9:
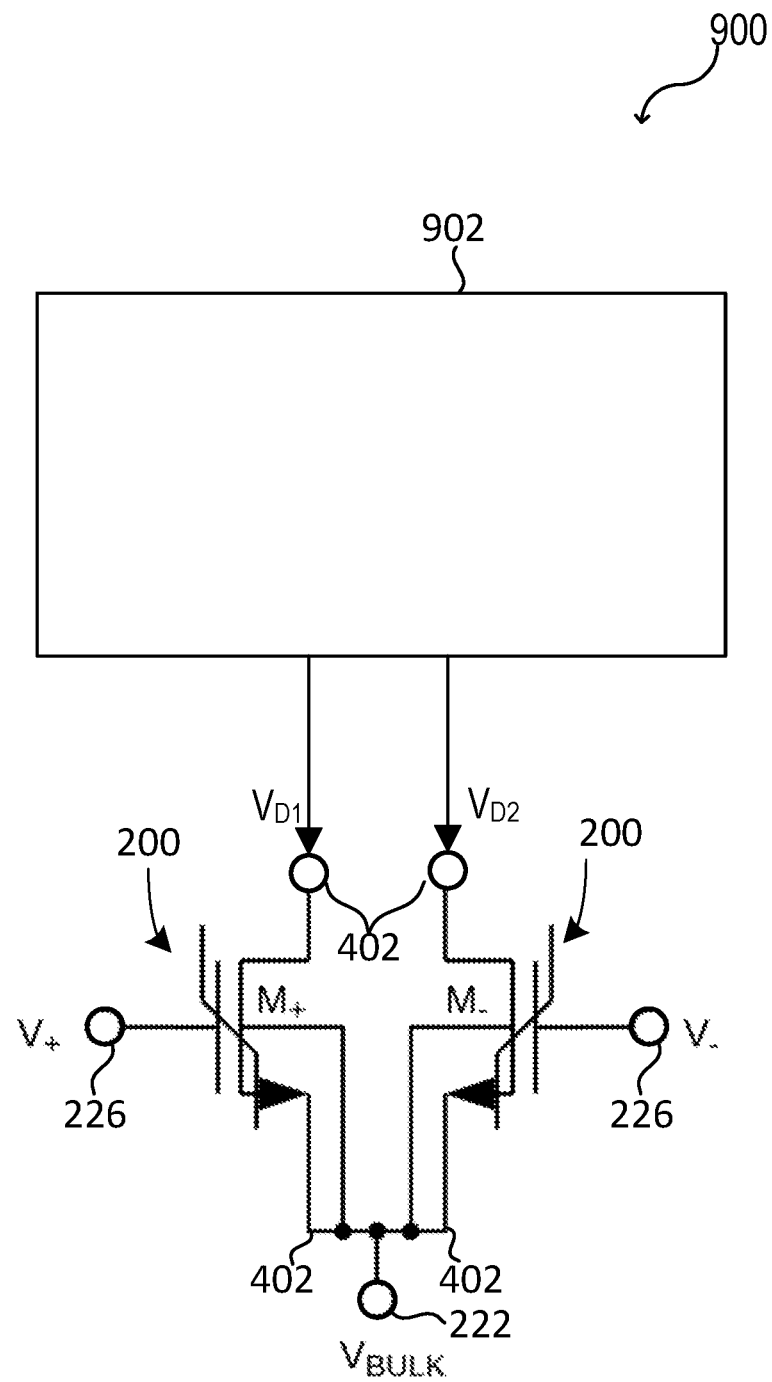

FIG. 9 illustrates a memory cell 400 in a schematic circuit diagram, in accordance with various aspects 900, including two memory cell members 200 and a third control circuit 902 (also referred to as drain-control circuit 902). The drain-control circuit 902 may be configured to control a fourth voltage (also referred to as first drain/source voltage $V_{D1}$) at the first drain/source terminal 402. The drain-control circuit 902 may be configured to control a fifth voltage (also referred to as second drain/source voltage $V_{D2}$) at the second drain/source terminal 402.

For example, the gate-control circuit 702 may be configured to control the first drain/source voltage $V_{D1}$ and/or the second drain/source voltage $V_{D2}$ according to the control schema 600. For example, the first drain/source voltage $V_{D1}$ and/or the second drain/source voltage $V_{D2}$ may be equal to the bulk voltage $V_{BULK}$, e.g., in one or more of the multiple phases of the control schema 600, e.g., at least in (e.g., throughout) the programming phase 601a and/or the erasing phase 601b.

In the following, reference is made to specific implementations of the memory cell 400, e.g., to specific implementations of the gate-control circuit, bulk-control circuit, and/or drain-control circuit, for demonstrative purposes, and is not intended to be limiting. The references made, e.g., to specific circuit implementations, may analogously apply to other implementations, which are configured to provide the described functions, e.g., in accordance with the control schema 600.

Figure 10:
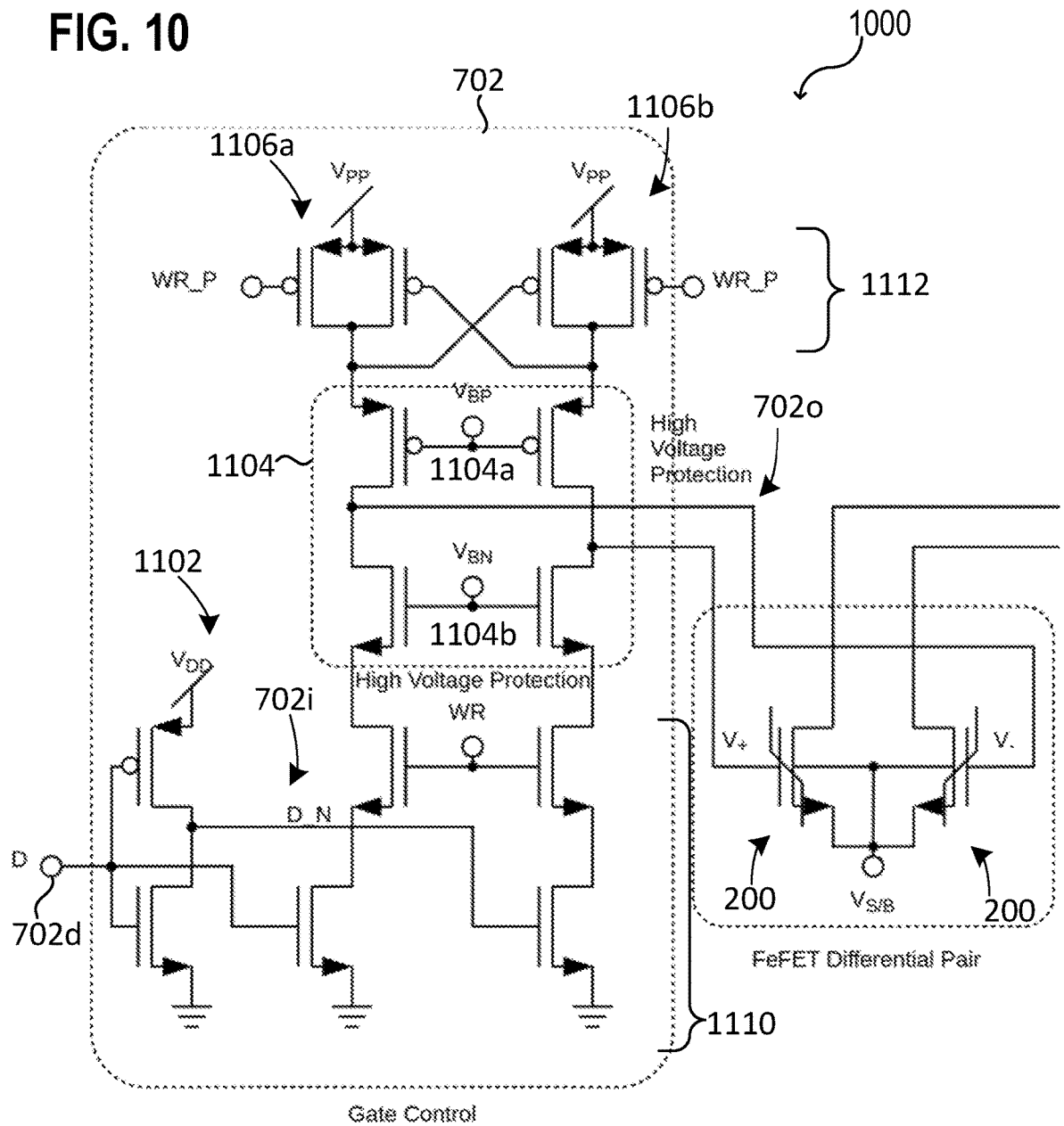

FIG. 10 illustrates a memory cell 400 in a schematic circuit diagram, in accordance with various aspects 1000, including two memory cell members 200 and the gate-control circuit 702. According to aspects 1000, the gate-control circuit 702 includes one or more level shifters, e.g., at least one level shifter per memory cell member 200. The one or more level shifters provide a less complex implementation of the gate-control circuit 702. Each of the one or more level shifters may be configured to translate one or more input signals (also referred to as data signals) from one logic level or voltage domain to the logic level or voltage domain of the gate voltages. Each data signal may be supplied to an input terminal 702i of the respective level shifter. Each gate voltage may be output at an output terminal 702o of the respective level shifter. For example, a first level shifter 1106a may be configured to convert a first data signal D into the first gate voltage $V_+$. For example, a second level shifter 1106b may be configured to convert a second data signal D_N into the second gate voltage $V_-$.

Each of the one or more level shifters may include a so called load circuit 1112 and a so called source circuit 1110. The source circuit 1110 may be coupled to the input terminal 702i of the respective level shifter. The respective output terminal 702o may be coupled between the load circuit 1112 and the source circuit 1110. The load circuit 1112 and/or the source circuit 1110 may be coupled serially between a high level supply voltage VPP and the base voltage VSS.

For example, the load circuit 1112 and/or the source circuit 1110 may include one or more transistors. For example, the load circuit 1112 may include two transistors coupled in parallel with each other. For example, the source circuit 1110 may include two transistors coupled serially with each other.

According to various aspects, the load circuit 1112 and/or the source circuit 1110 (e.g., its resistance) may be controlled by one or more respective signals. For example, the source circuit 1110 of each level shifter may be controlled by the respective data signal supplied to the level shifter and/or by a respective first write signal (also referred to as WR or PRG or PRG_B) signal supplied to the level shifter. For example, the load circuit 1112 of each level shifter may be controlled by a respective second write signal (also referred to as WR_P or PRG_P) supplied to the level shifter.

In operation, the difference between the first gate voltage $V_+$ and the second gate voltage $V_-$ may be a function of the voltage of PRG. For example, the difference of the first gate voltage $V_+$ and the second gate voltage $V_-$ may be reduced when PRG is changed from "high" (e.g., VDD) to "low" (e.g., VSS and/or 0 volt). For example, the first gate voltage $V_+$ and the second gate voltage $V_-$ may differ from each other by VDD or less than VDD, when PRG is "low" (e.g., VSS and/or 0 volt). For example, the first gate voltage V+ and the second gate voltage $V_-$ may differ from each other by more than VDD, when PRG is "high" (e.g., VDD). For example, the first gate voltage $V_+$ and the second gate voltage $V_-$ may differ from each other by VPP, when PRG is "high" (e.g., VDD).

For example, PRG_P and PRG may be provided similar to each other (e.g., being changed synchronous to each other), but differing in their absolute voltage level (e.g., peak-to-peak value) or voltage range from each other. For example, the voltage range of PRG_P may be the range from VSS to VPP. PRG_P may be provided such that the controlled transistor (e.g., a PMOS) becomes conductive but is not stressed. For example, PRG_P may be provided based on PRG, e.g., by a level shifter. For example, the time dependent voltage of PRG_P, $V_{PRG\_P}(t)$ and the time dependent voltage of PRG, $V_{PRG}(t)$, may be linked to each other, e.g., by a time-independent scalar $C_V$. For example, $\Delta V_{PRG\_P}(t)=C_V \cdot \Delta V_{PRG}(t)$. For example, PRG_P<VPP-V$_{th}$ when PRG=0 V. For example, If PRG_P=VPP when PRG is "high" (e.g., being at 1 V).

The first write signal WR and/or the second write signal WR_P may be "high" in (e.g., throughout) the programming phase 601*a* of the control schema 600 and/or the erasing phase 601*b* of the control schema 600. For example, the first write signal WR and/or the second write signal WR_P being "high" may provide for the programming operation and/or the erasing operation. The first write signal WR and/or the second write signal WR_P may be "low" before the programming phase 601*a* of the control schema 600 and/or after the erasing phase 601*b* of the control schema 600.

Optionally, each of the one or more level shifters may include a voltage protection circuit 1104, e.g., coupled between the load circuit 1112 and the source circuit 1110. Each voltage protection circuit 1104 may include one or more voltage protection stages 1104*a*, 1104*b*. For example, each voltage protection circuit 1104 may include a cascode circuit, e.g., a controllable cascode circuit. For example, each cascode stage may provide a voltage protection stage 1104*a*, 1104*b*. The signals for controlling the cascode circuit may be referred to as $V_{BP}$ and $V_{BN}$. The voltage protection circuit 1104 may be used when VPP exceeds a certain voltage level suitable for operating the circuit elements of the level shifter.

The first and second data signals D and D_N may be inverted to each other. For example, the first data signal D may be "low" (e.g., at VSS) when the second data signal D_N is "high" (e.g., VDD). For example, the first data signal D may be "high" (e.g., at VDD) when the second data signal D_N is "low" (e.g., VSS). For example, a voltage of the first data signal D may be increased when a voltage of the second data signal D_N is decreased. For example, a voltage of the first data signal D may be decreased when a voltage of the second data signal D_N is increased.

According to various aspects, the first and second data signals D and D_N may be generated externally from the gate-control circuit 702 and may be supplied to the gate-control circuit 702. In the illustrated example, the memory cell 400 may include an inverter circuit 1102 configured to generate the second data signal D_N based on the first data signal D supplied to an data terminal 702*d* of the memory cell 400. However, other implementations may be suitable for providing the first and second data signals D and D_N, e.g., to the data terminal 702*d*. Thus, the references made to the first and second data signals D and D_N and the respective inverter circuit 1102 may be understood as examples, for demonstrative purposes, and is not intended to be limiting. The references may analogously apply to other implementations for controlling the one or more level shifters of the gate-control circuit 702.

Figure 11:
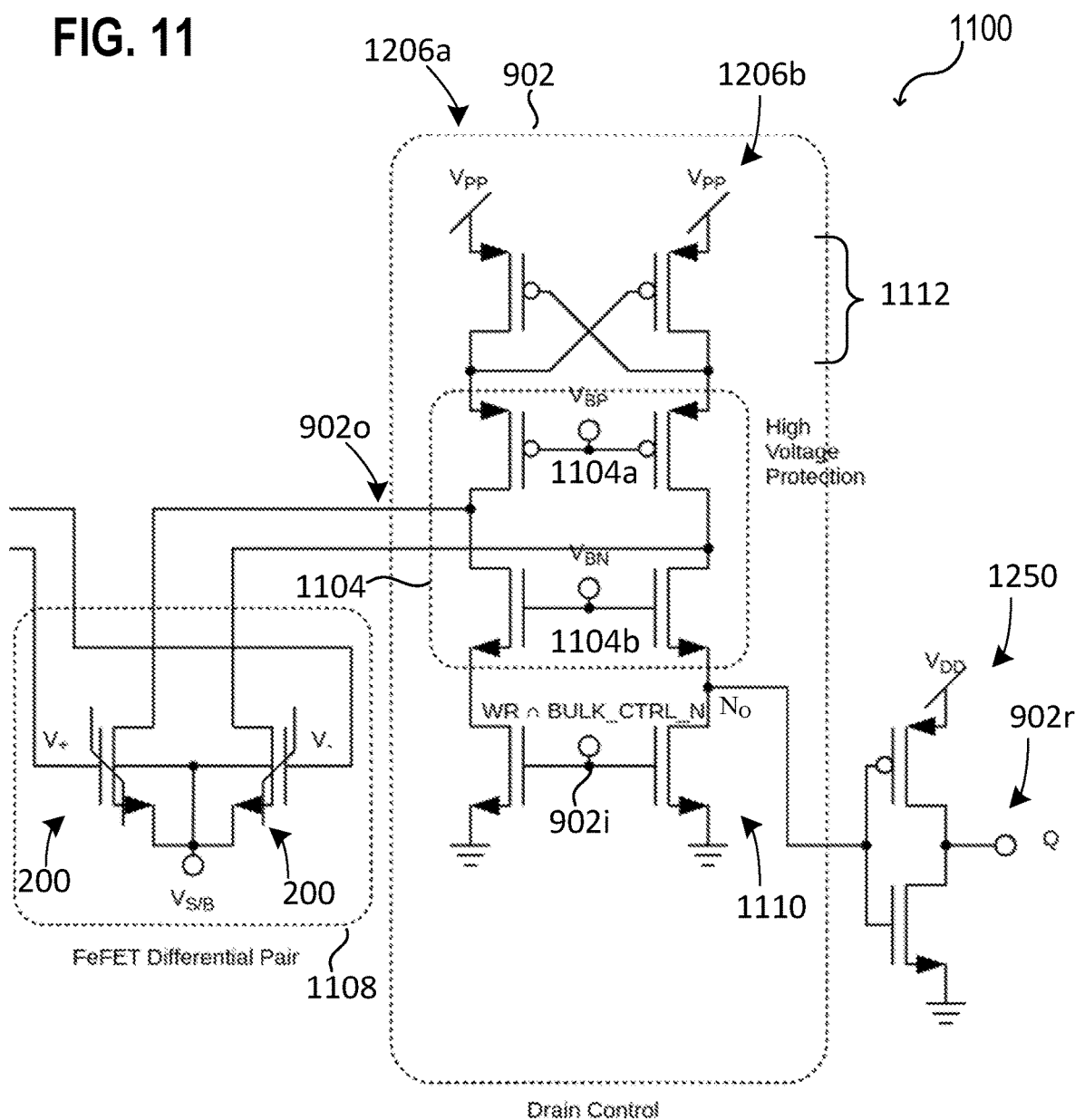

FIG. 11 illustrates a memory cell 400 in a schematic circuit diagram, in accordance with various aspects 1100, including two memory cell members 200 and the drain-control circuit 902. According to aspects 1100, the drain-control circuit 902 includes one or more level shifters (also referred to as drain control level shifters), e.g., at least one level shifter per memory cell member 200. The one or more level shifters provide a less complex implementation of the drain-control circuit 902. Each of the one or more level shifters may be configured to translate an input signal (also referred to as drain control signal or as WR∩BULK_C-TRL_N) from one logic level or voltage domain to the logic level or voltage domain of the drain/source voltages. The drain control signal may be supplied to an input terminal 902*i* of the drain-control circuit 902. Each drain/source voltage may be output at an output terminal 902*o* of the respective level shifter. For example, a first level shifter 1206*a* may be configured to convert the drain control signal into the first drain/source voltage $V_{D1}$. For example, a second level shifter 1206*b* may be configured to convert the drain control signal into the second drain/source voltage $V_{D2}$.

Each of the one or more drain control level shifters may include a so called load circuit 1112 and a so called source circuit 1110. The source circuit 1110 may be coupled to or be controlled by the input terminal 902*i* of the drain-control circuit 902. The respective output terminal 902*o* may be coupled between the load circuit 1112 and the source circuit 1110. The load circuit 1112 and/or the source circuit 1110 may be coupled serially between a high level supply voltage VPP and the base voltage VSS.

For example, the load circuit 1112 and/or the source circuit 1110 may include one or more transistors. For example, the transistors of the load circuit 1112 may be cross-coupled with each other, e.g., such that they are controlled by each other. For example, the source circuit 1110 may include two transistors, of which each is gate-coupled to the input terminal 902*i* of the drain-control circuit 902. The source circuit 1110 of each level shifter may be controlled by the drain control signal.

Optionally, each of the one or more level shifters may include a voltage protection circuit 1104, e.g., coupled between the load circuit 1112 and the source circuit 1110. Each voltage protection circuit may include a cascode circuit, e.g., a controllable cascode circuit. The signals for controlling the cascode circuit may be referred to as $V_{BP}$ and $V_{BN}$. The voltage protection circuit 1104 may be used when VPP exceeds a certain voltage level suitable for operating the circuit elements of the level shifter.

According to various aspects, the memory cell 400 may include a read-out terminal 902*r*, the read-out terminal 902*r* may be coupled to an output node $N_O$ between the load circuit 1112 and the source circuit 1110, e.g., via an optional read-out signal converter 1250 or directly. The read-out signal converter 1250 may be configured to convert the voltage at the output node $N_O$ into the read-out signal Q. For example, the read-out signal converter 1250 may include an inverter circuit configured to output an invert of the voltage at the output node $N_O$. For example, the read-out signal converter 1250 may include a level shifter configured to convert the voltage at the output node $N_O$ being "high" to VDD.

Figure 12:
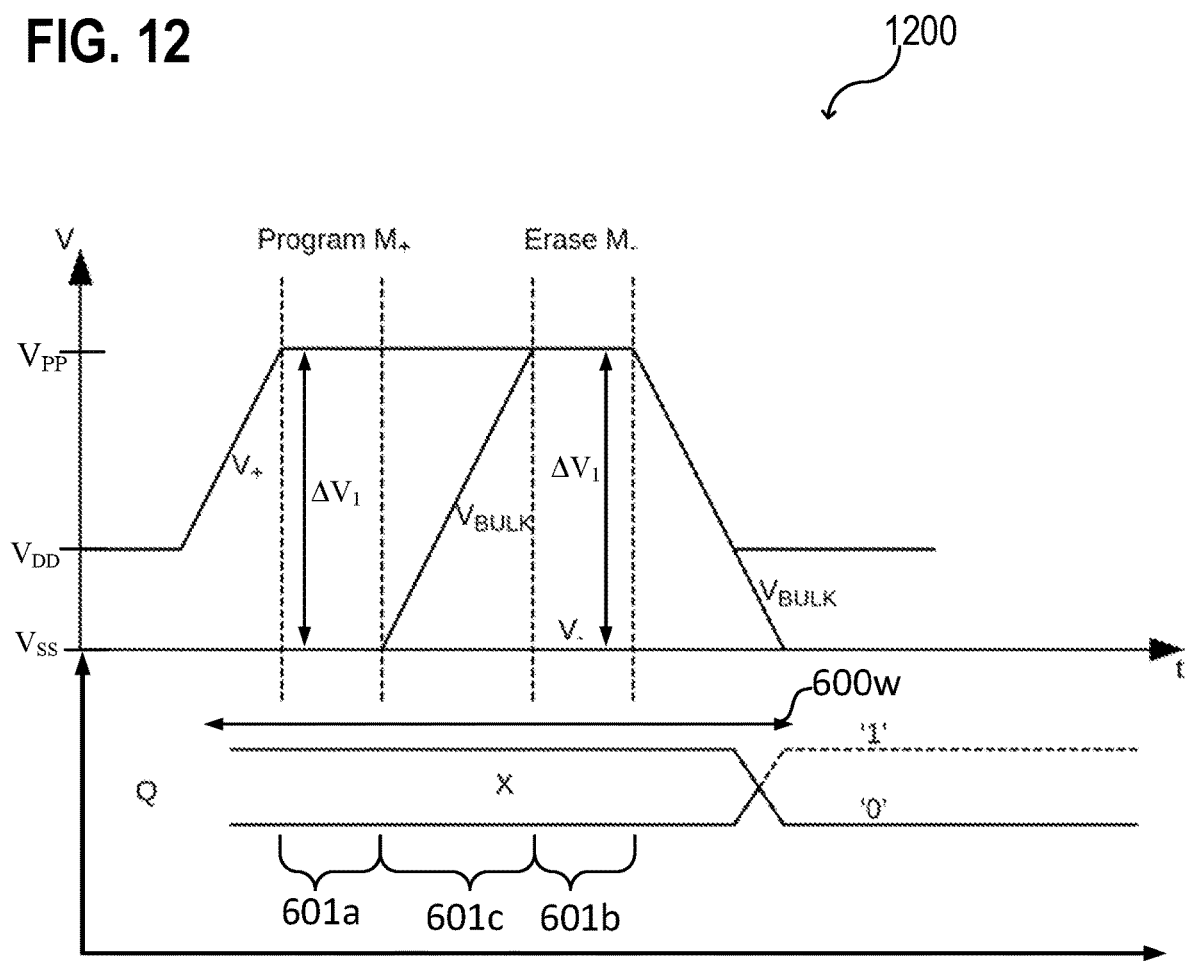
FIG. 12 shows a control schema for the memory cell in a schematic diagram according to various aspects.

FIG. 12 illustrates a control schema 1200 for the memory cell 400 in a schematic diagram according to various aspects, the diagram illustrating the voltage value V over the time t. The control schema 1200 may implement a writing operation 600*w* (e.g. including a programming operation and an erasing operation) as detailed above. Depending on the state of the one or more data signals (e.g., being "high" or "low") in (e.g., throughout) the writing operation, the read-out signal Q may be "high" (e.g., representing a logical 1) or "low" (e.g., representing a logical 0).

Figure 13:
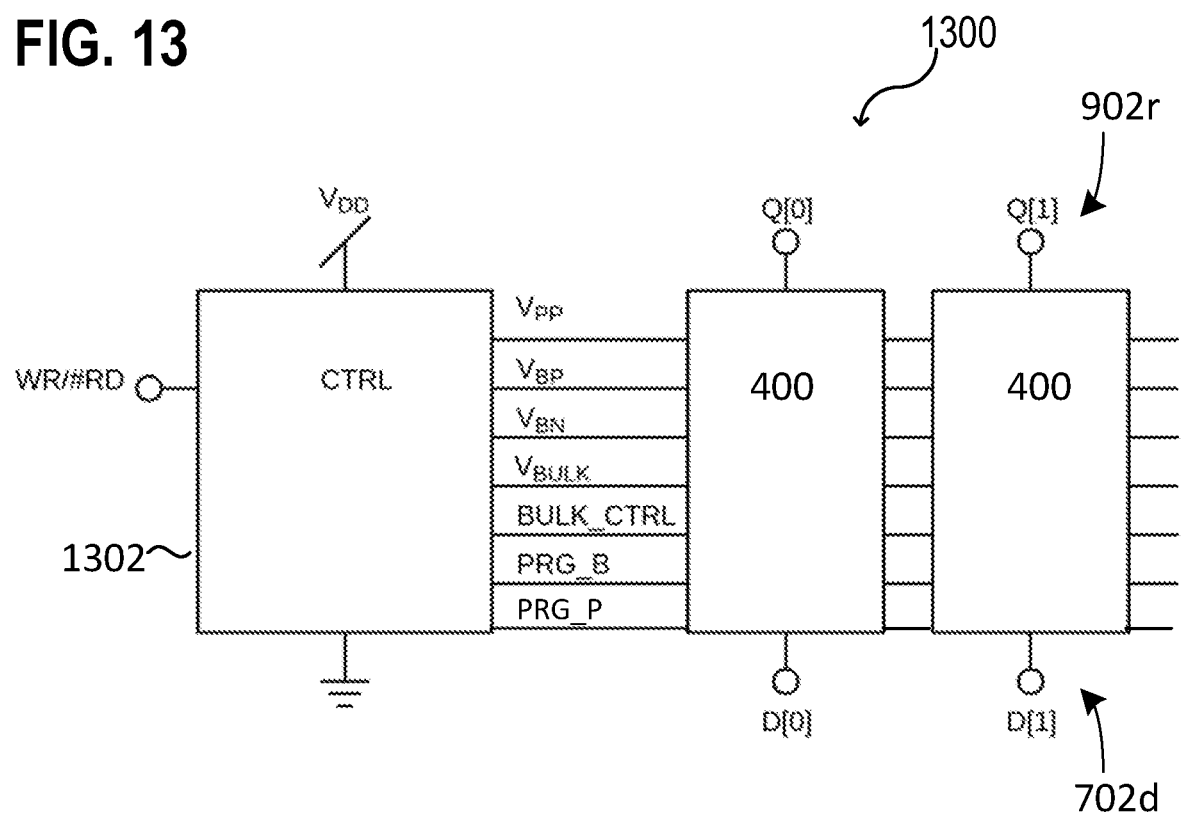
FIG. 13 shows a memory circuit in a schematic view, in accordance with various aspects.

FIG. 13 illustrates a memory circuit 1300 in a schematic circuit diagram, in accordance with various aspects, including multiple memory cells 400 and a supply circuit 1302 (CTRL). As illustrated, the supply circuit 1302 may optionally include a common bulk-control circuit 802 for the multiple memory cells 400.

The supply circuit 1302 may be configured to generate one or more voltages of the following voltages supplied to each memory cell 400: VPP, optional $V_{BP}$, optional $V_{BN}$, optional $V_{BULK}$, BULK_CTRL, PRG_B, and/or PRG_P. The one or more voltages may be generated based on a driving signal (also referred to as WR/#RD). Illustratively, the driving signal may instruct, if the memory cell 400 is written or read. The supply circuit 1302 may be coupled to VSS (e.g., ground) and VDD.

Each memory cell 400 of the multiple memory cells 400 may include the read-out terminal 902r and the data terminal 702d. The read-out terminal 902r and the data terminal 702d of each memory cell 400 may be addressable.

In general, a memory circuit 1300 (e.g. an array including a set of memory cells) may be operated based on one or more writing operations (e.g. including a programming operation and/or erasing operation) and/or one or more read-out operation. In the writing operation, as example, predefined voltages may be applied at electrical lines (also referred to as control lines or driver lines), wherein the electrical lines may be connected to the respective nodes of the memory cells 400 to allow for the desired operation. The electrical lines may be referred to, for example, as word lines, source lines, and/or bit lines.

In general, a memory circuit 1300 may include a set of (e.g. volatile or non-volatile) memory cells 400, which may be accessed individually or in blocks, depending on the layout of the memory circuit 1300 and/or the corresponding addressing scheme. For example, the memory cells may be arranged in a matrix architecture (A(n,m)) including columns, for example a number n of columns, and rows, for example a number m of rows, with n and m being integer numbers greater than one. In the matrix architecture, each memory cell may be connected to control lines (e.g. to a word line and to a bit line), which may be used to supply voltages to the memory cells for performing one or more writing operations and one or more read-out operations. The matrix architecture may be, for example, referred to as "NOR" or "NAND" architecture, depending on the way neighboring memory cells 400 are connected to each other, i.e. depending on the way the terminals of neighboring memory cells 400 are shared, but are not limited to these two types (another type is for example an "AND" architecture).

Various aspects are related to a memory circuit 1300 including a plurality of memory cells 400 (also referred to as set of memory cells 400). As an example, a control circuit (e.g., including an addressing circuit) may be configured to carry out and/or instruct one or more read-out operations associated with a read-out of one or more memory cells 400 of the memory circuit 1300. In some aspects, a control circuit may be used to control a read-out of a single memory cell 400 of the memory circuit 1300 that is intended to be read-out, wherein the rest of the memory cells 400 of the memory circuit 1300 are not read-out and not intended to be read-out.

Various aspects are related to a memory cell circuit 1300 that is configured to carry out read-out operations efficiently.

According to various aspects, a current integrator circuit may be used to read-out one or more ferroelectric capacitors (FeCap) of one or more arrays of ferroelectric capacitors.

According to various aspects, a parasitic capacitance on a bit-line (BL) is reduced or eliminated. This enables to increase the number of circuit elements (e.g., memory cells) connected by the BL, e.g., without suffering from the increased parasitic capacitance (e.g., per memory cell). For example, a limitation of BL length, e.g., due to the capacitive ratio of the read-out to not read-out FeCaps, may be reduced or removed.

According to various aspects, a compensation mechanism may be applied to eliminate the dielectric current of the FeCap and only sense the switching charge.

According to various aspects, the sense circuit may be disposed below (regarding the layer stack of the integrated circuit) a FeCap array, such that the consumed area is minimized.

According to various aspects, a FeCap memory array may be read-out by measuring the read-out current (e.g., including the dielectric current and a switching charge current), which is a response to the switching of the dipoles in the ferroelectric layer, when a voltage higher than the coercive voltage (as example for the switching voltage) is applied over the FeCap. The read-out current is indicative, in which of the two memory states the ferroelectric material (e.g., programmed or erased) at the time of the read-out.

For example, a memory cell may generate a displacement current, which is output by the memory cell as read-out current. The displacement current is proportional to the change of the electric displacement field D. The electric displacement field may be written as $D=\varepsilon_0 \cdot E+P$, wherein $\varepsilon_0$ is the permittivity of free space, E is the electric field intensity, and P is the polarization of the memory cell. Thus, a change in the polarization P contributes to D.

Figure 14:
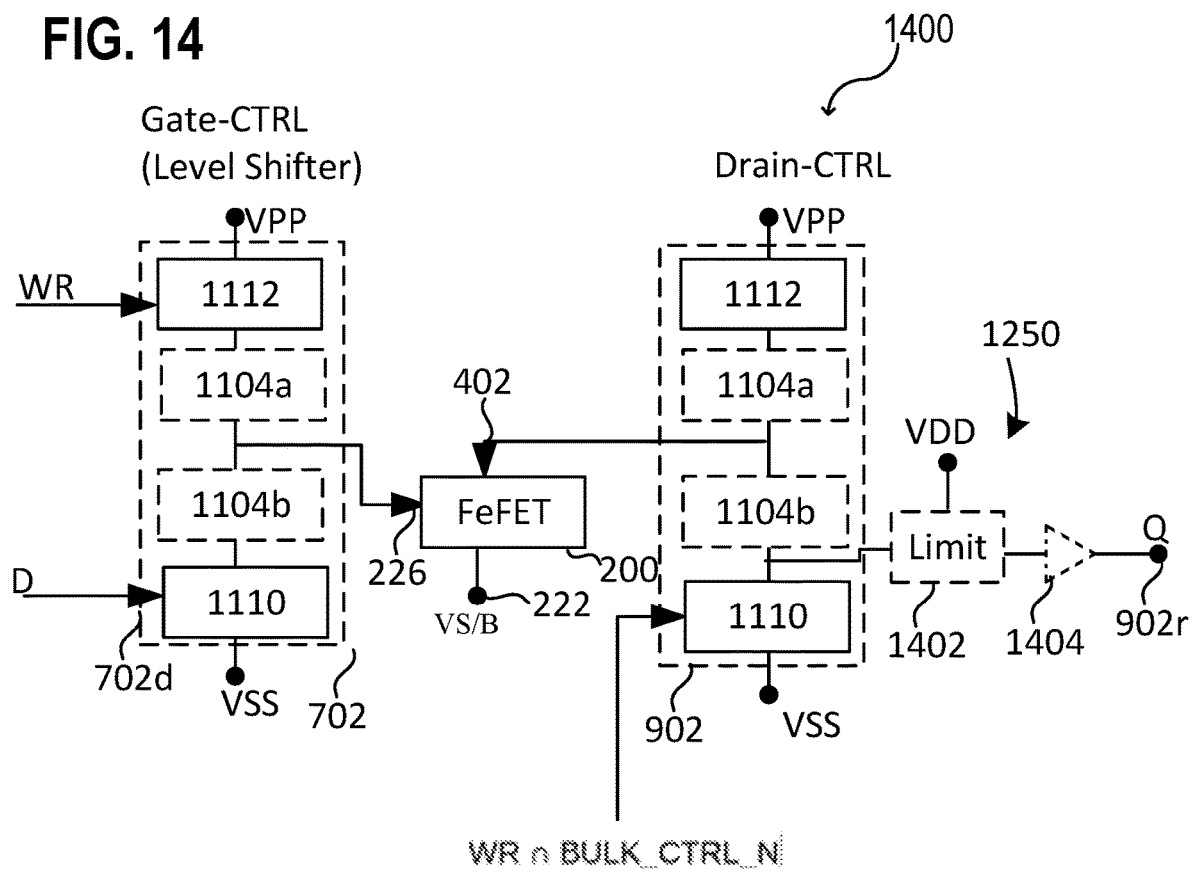
FIG. 14 and FIG. 15 respectively show a memory cell in a schematic view, in accordance with various aspects.

FIG. 14 illustrates a memory cell 400 in a schematic circuit diagram, in accordance with various aspects 1400. As illustrated, the gate-control circuit 702 and/or the drain-control circuit 902 may optionally include a first voltage protection stage 1104a coupled between the load circuit 1112 and the memory cell member 1400. Analogously, the gate-control circuit 702 and/or the drain-control circuit 902 may optionally include a second voltage protection stage 1104b coupled between the source circuit 1110 and the memory cell member 1400.

The read-out signal converter 1250 may optionally include a limiting circuit 1402 and/or an inverter circuit 1404.

Figure 15:
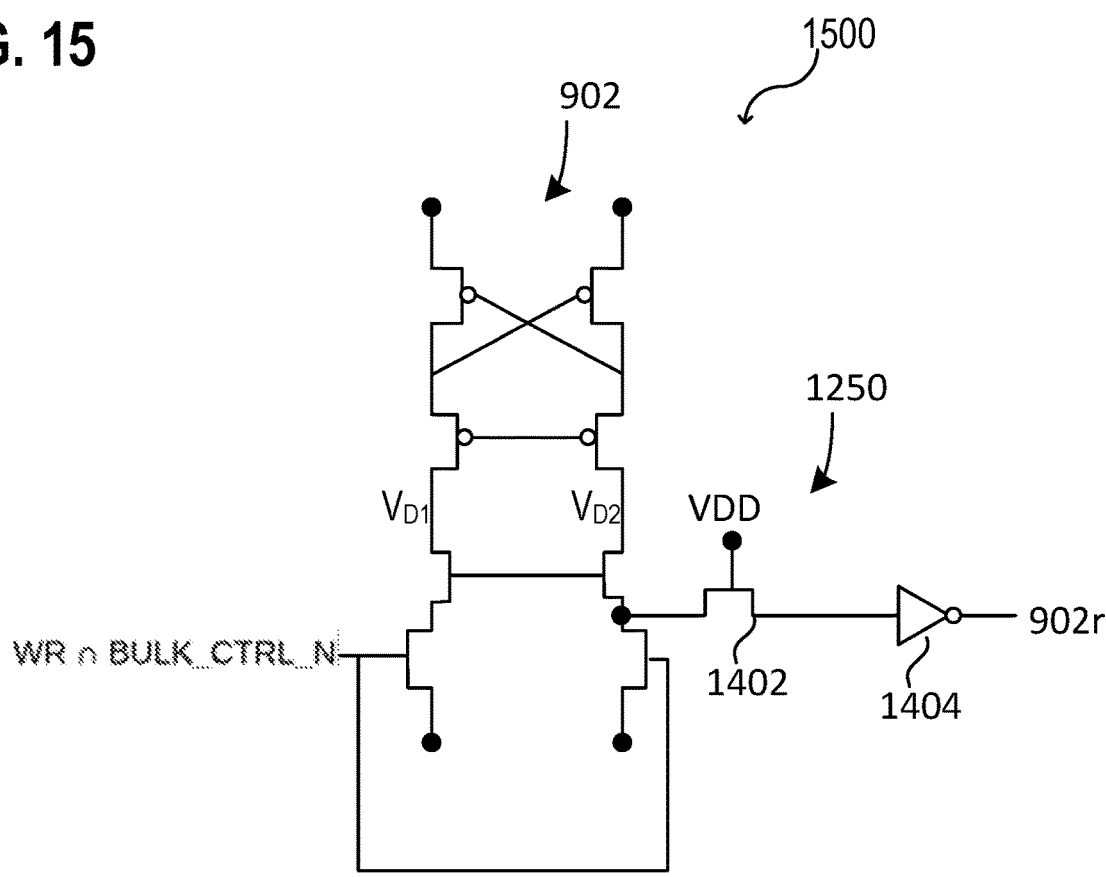

FIG. 15 illustrates a memory cell 400 in a schematic circuit diagram, in accordance with various aspects 1500. As illustrated, the limiting circuit 1402 may include one or more transistors, e.g., providing a cascode circuit (e.g., including multiple serially coupled transistors).

Figure 16:
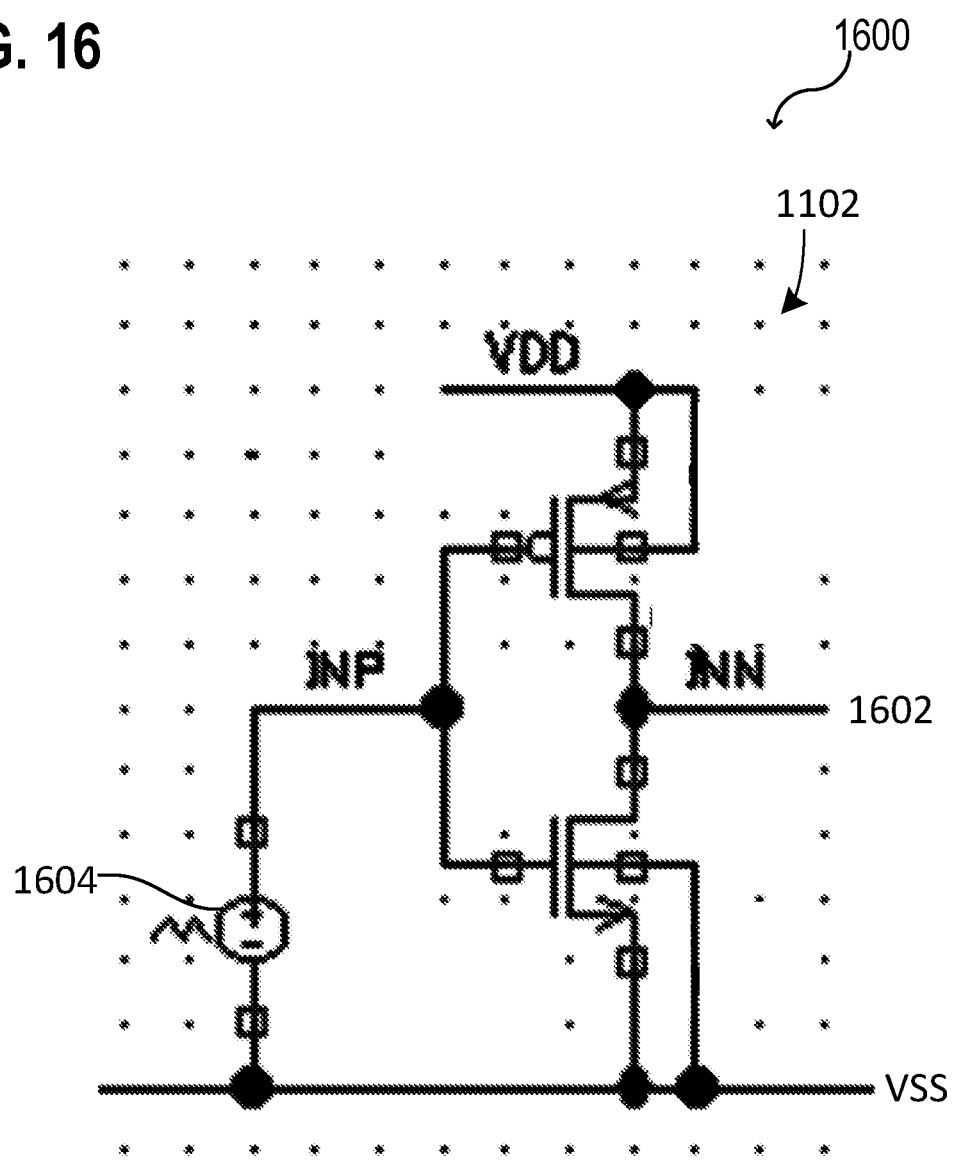
FIG. 16 shows a data signal generator of the memory cell in a schematic view, in accordance with various aspects.

FIG. 16 illustrates a data signal generator 1600 of the memory cell 400 in a schematic circuit diagram, in accordance with various aspects. Generally the data signal generator 1600 may be configured to generate the first data signal D and the second data signal D_N (also referred to as inverted first data signal D), which are inverted to each other.

In the illustrated implementation, the data signal generator 1600 may include an inverter circuit 1102 coupled between VDD and VSS. An output terminal of the inverter circuit 1102 may be coupled to an input terminal 702i of the gate-control circuit 702, e.g., to the input terminal 702i of the second level shifter 1106b of the gate-control circuit 702.

Further, the data signal generator 1600 may include a data signal source 1604 coupled between an input terminal of the inverter circuit 1102 and VSS. The data signal source 1604 may be configured to generate the first data signal D (also referred to as INP). The inverter circuit 1102 may be configured to generate the second data signal D_N (also referred to as INN) based on the first data signal D.

Figure 17:
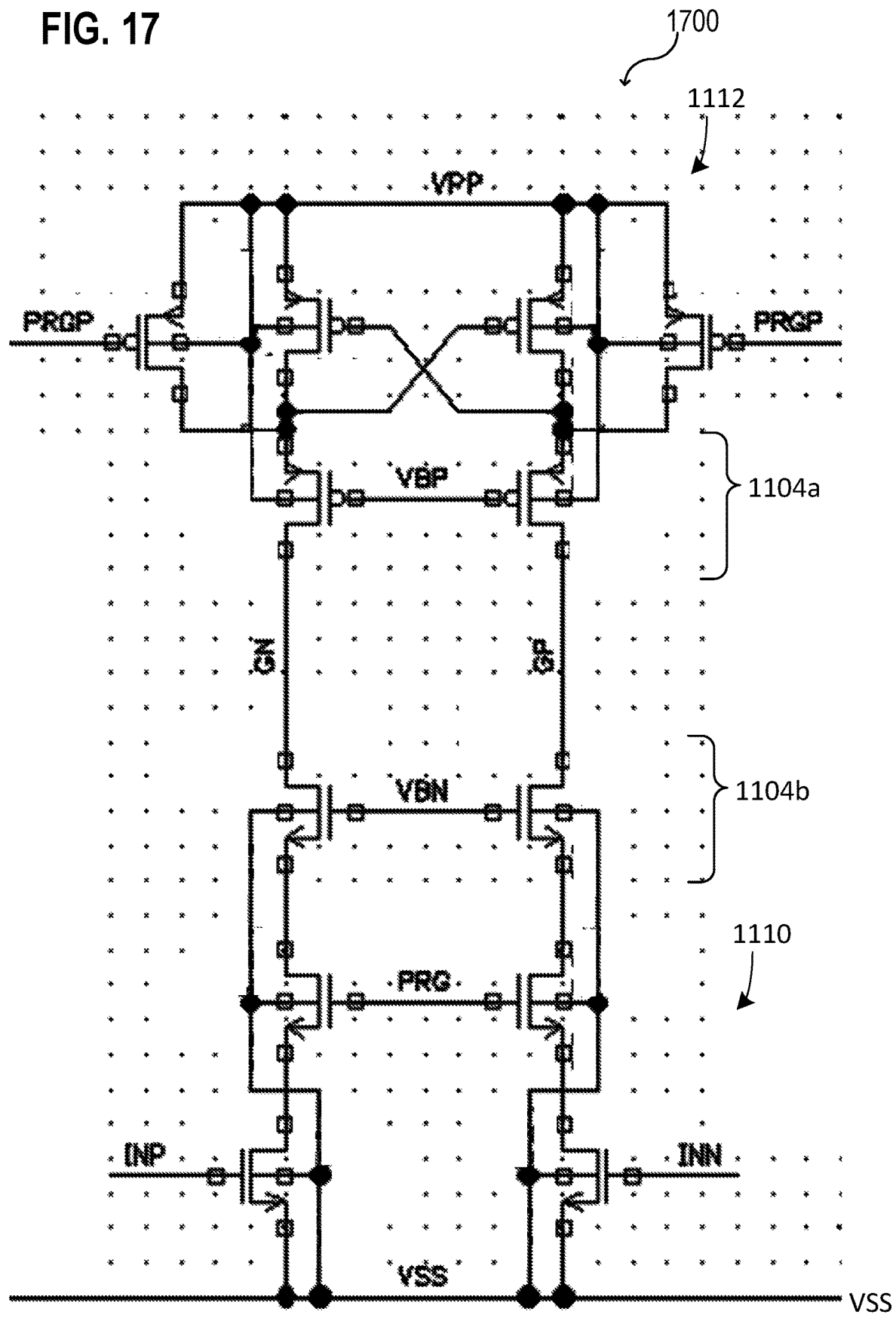
FIG. 17 shows the gate-control circuit of the memory cell in a schematic view, in accordance with various aspects.

FIG. 17 illustrates the gate-control circuit 702 of the memory cell 400 in a schematic circuit diagram, in accordance with various aspects 1700. Generally, the gate-control circuit 702 may be configured to provide the first gate voltage $V_+$ (also referred to as GP) based on the first data signal D and to provide the second gate voltage $V_-$ (also referred to as GN) based on the second data signal D_N. The gate-control circuit 702 may optionally be configured to provide GP and GN further based on PRG_P (also referred to as PRGP) and/or on PRG. As detailed above, PRG_P may be provided based on PRG, e.g., as a function of PRG_P, or vice versa. The gate-control circuit 702 may optionally be configured to provide GP and GN further based on one or more voltage protection control signals, e.g., $V_{BP}$ and/or $V_{BN}$.

Figure 18:
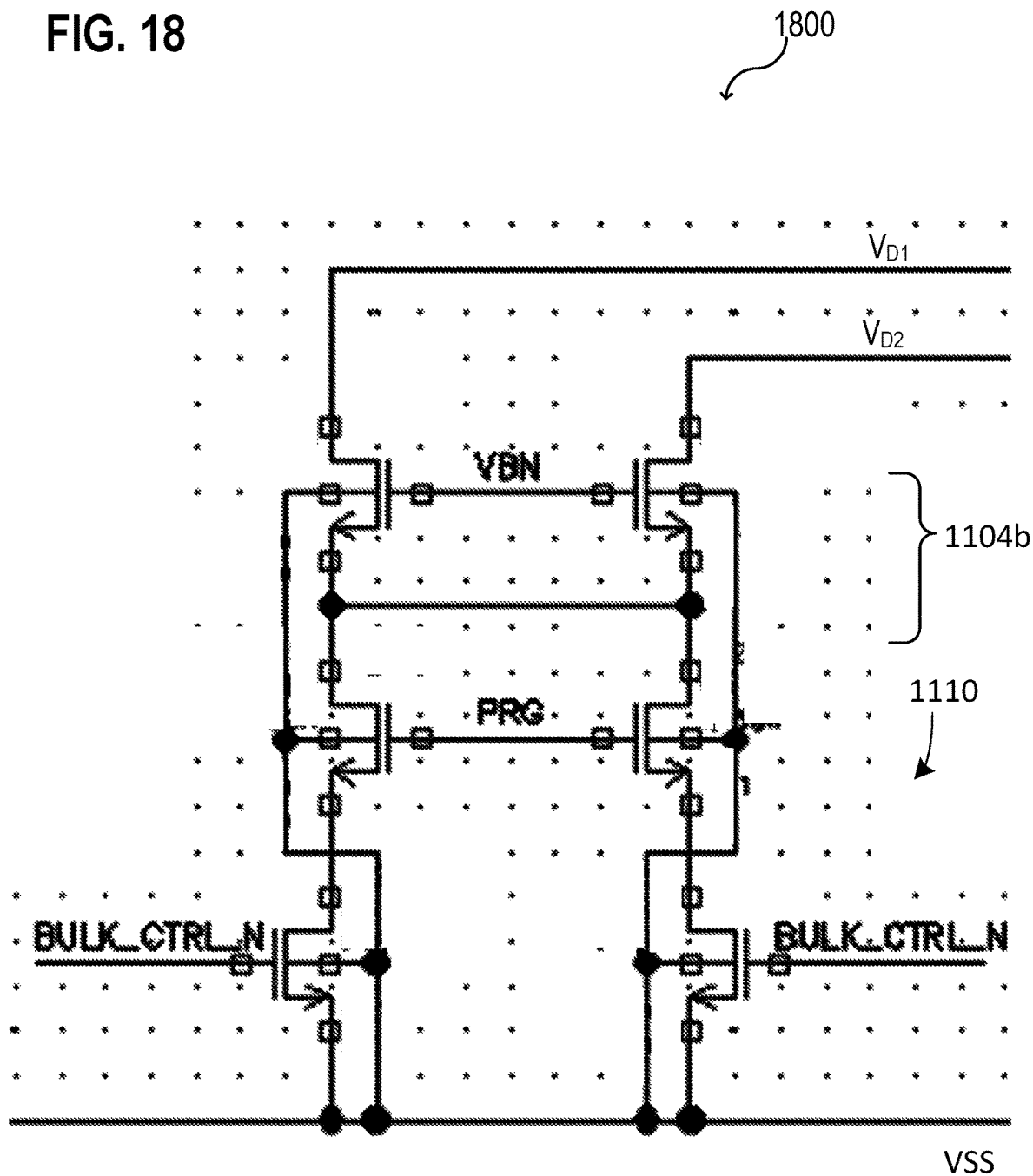
FIG. 18 shows the drain-control circuit of the memory cell in a schematic view, in accordance with various aspects.

FIG. 18 illustrates the drain-control circuit 902 of the memory cell 400 in a schematic circuit diagram, in accordance with various aspects 1800. Generally, the drain-control circuit 902 may be configured to provide the first drain/source voltage $V_{D1}$ and/or the second drain/source voltage $V_{D2}$ based on the bulk control signal (also referred to as BULK_CTRL_N or to as BULK_CTRL) and/or based on PRG. The drain-control circuit 902 may optionally be configured to provide the first drain/source voltage $V_{D1}$ and/or the second drain/source voltage $V_{D2}$ further based on one or more voltage protection control signals, e.g., $V_{BP}$ and/or $V_{BN}$.

As detailed above, the first voltage protection stage 1104a and the second voltage protection stage 1104b are optional.

Figure 19:
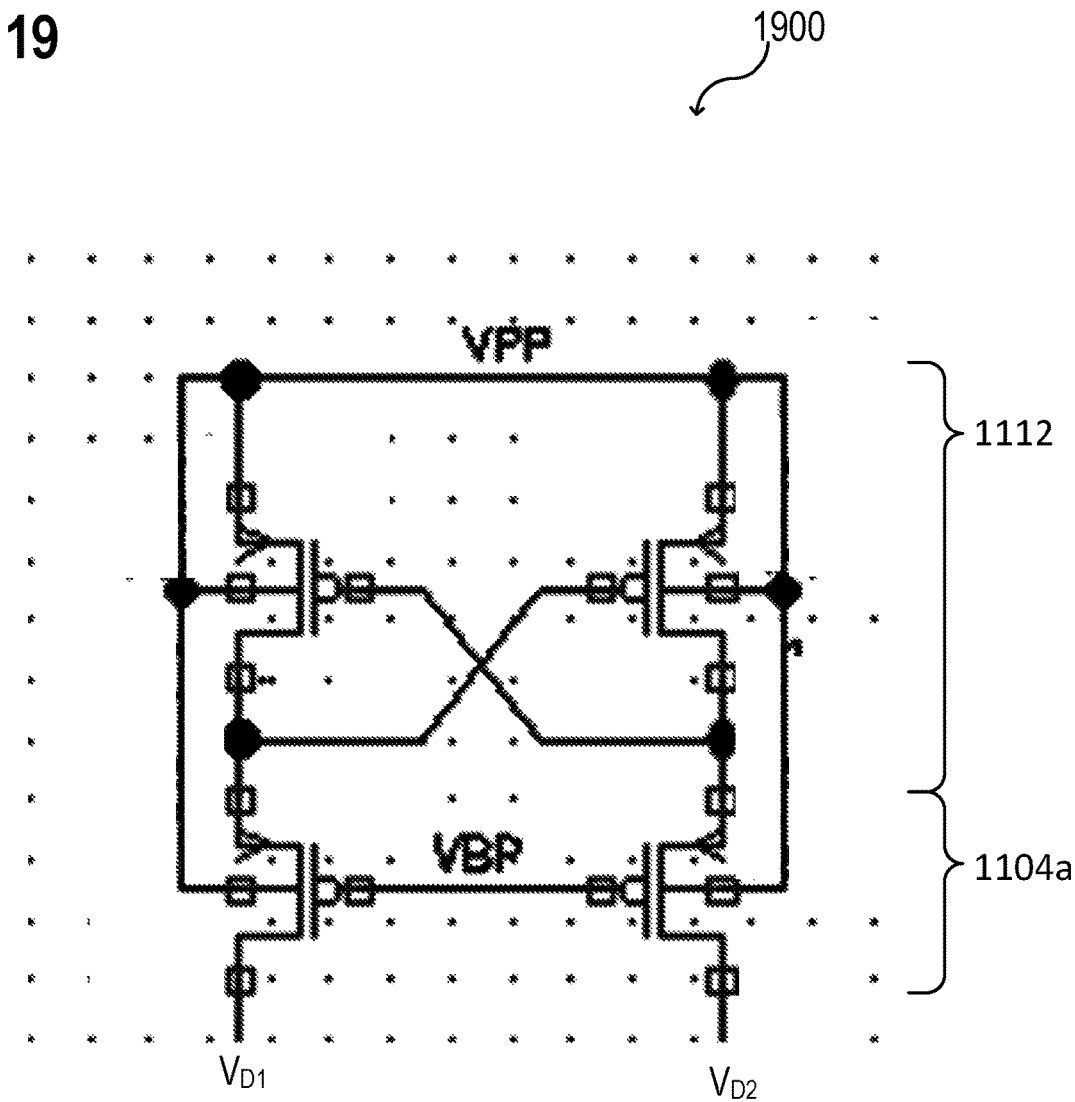
FIG. 19 shows the drain-control circuit of the memory cell in a schematic view, in accordance with various aspects.

FIG. 19 illustrates the drain-control circuit 902 of the memory cell 400 in a schematic circuit diagram, in accordance with various aspects 1900, e.g., the load circuit 1112 and the optional first voltage protection stage 1104a. In the illustrated implementation, the load circuit 1112 and the optional first voltage protection stage 1104a of the drain-control circuit 902 may provide a part of a read-out circuit. The read-out circuit may optionally further include the read-out signal converter 1250.

Figure 20:
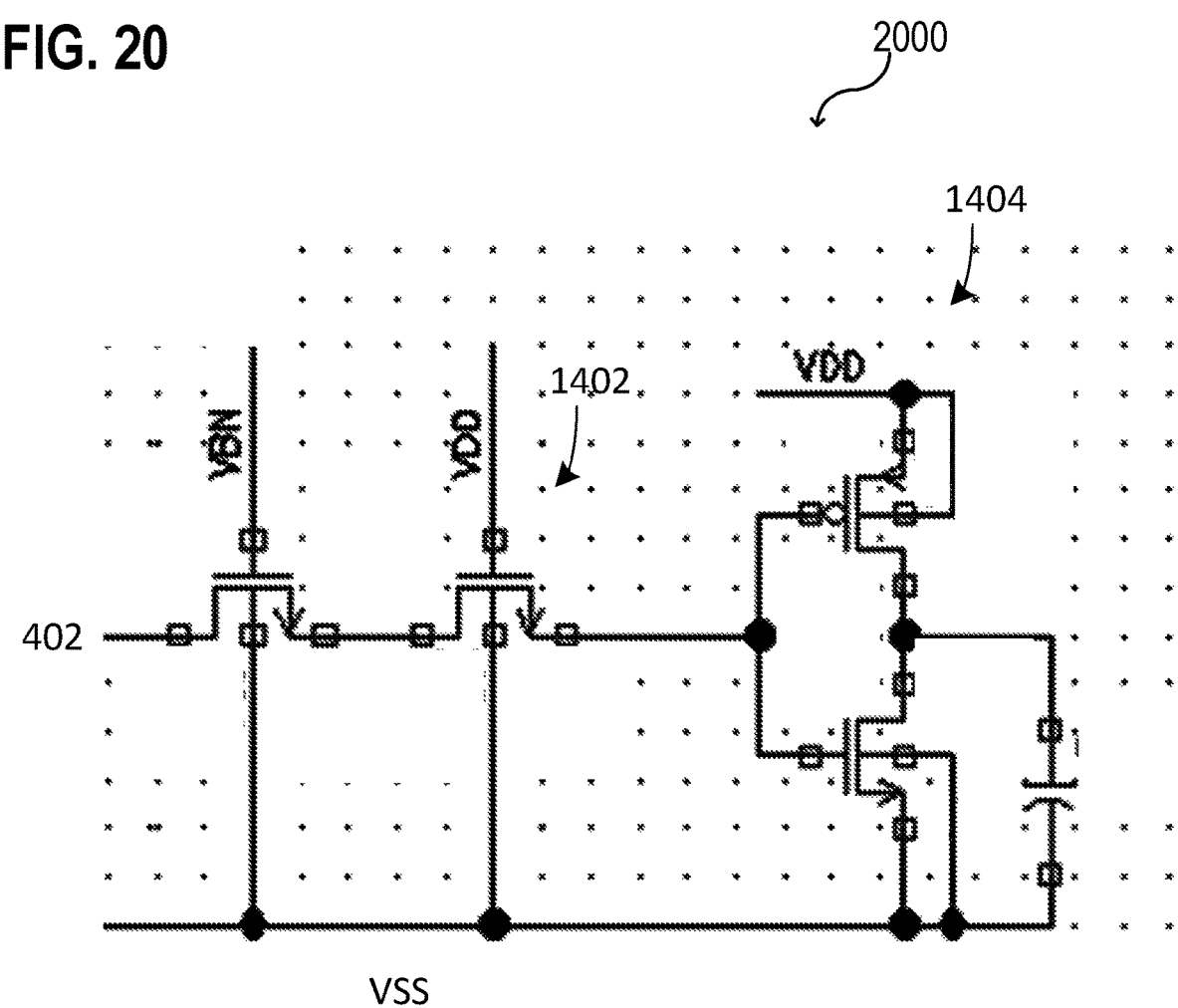
FIG. 20 shows the read-out signal converter of the memory cell in a schematic view, in accordance with various aspects.

FIG. 20 illustrates the read-out signal converter 1250 of the memory cell 400 in a schematic circuit diagram, in accordance with various aspects 2000. The read-out signal converter 1250 may be coupled to a drain terminal 402 of the first memory cell member 200 or of the second memory cell member 200.

The limiting circuit 1402 of the read-out signal converter 1250 may include a first transistor, of which the gate is coupled to VBN. Additionally or alternatively, the limiting circuit 1402 of the read-out signal converter 1250 may include a second transistor, of which the gate is coupled to VDD.

Figure 21:
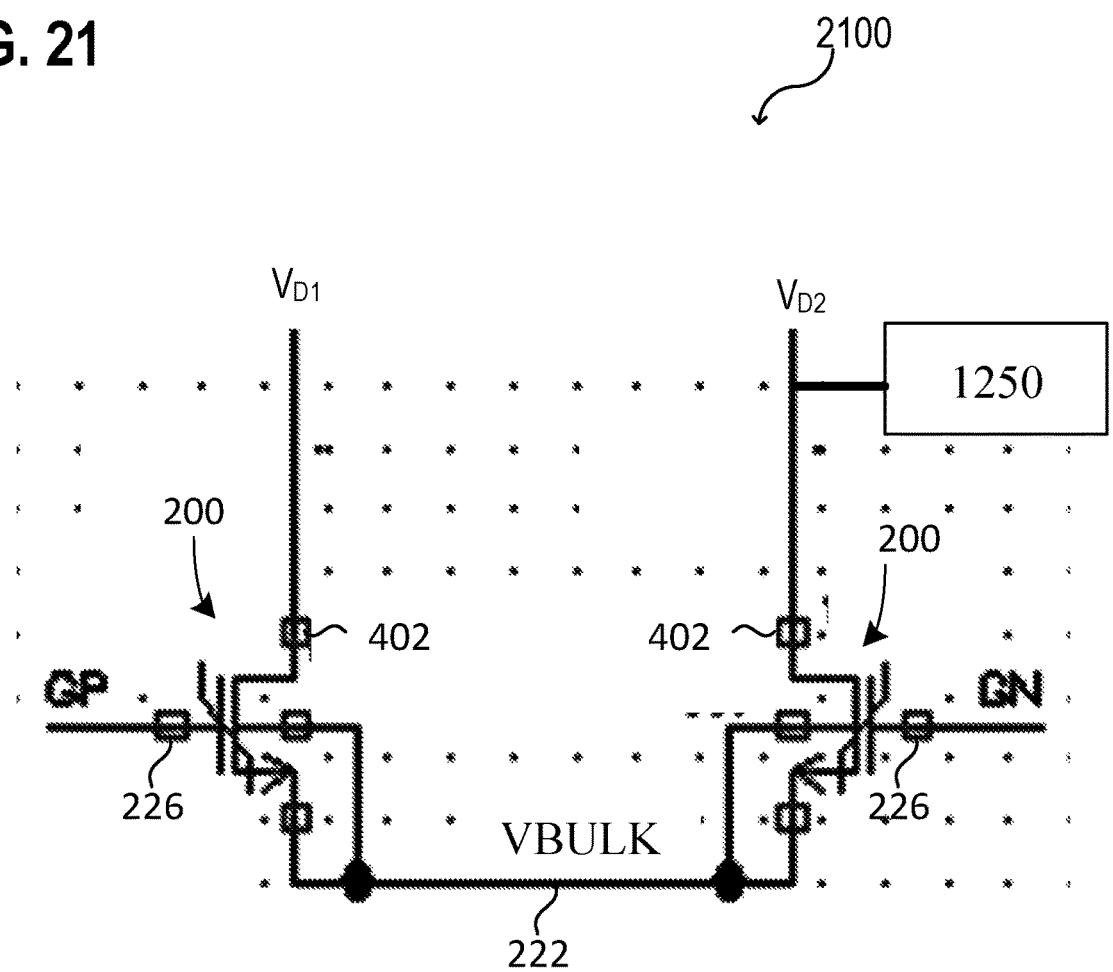
FIG. 21 shows the differentially connected two memory cell members of the memory cell in a schematic view, in accordance with various aspects.

FIG. 21 illustrates the differentially connected two memory cell members 200 (also referred to as differential storage pair 1108) of the memory cell 400 in a schematic circuit diagram, in accordance with various aspects 2100. The bulk terminal 222 may be connected to the source region 200c of the first memory cell member 200 of the differential storage pair 1108 and to the source region 200c of the second memory cell member 200 of the differential storage pair 1108.

For example, the first drain/source voltage $V_{D1}$ and/or the second drain/source voltage $V_{D2}$ may be equal to $V_{BULK}$ in (e.g., throughout) the programming phase 601a and/or the erasing phase 601b of the control schema 600. Additionally or alternatively, the first drain/source voltage $V_{D1}$ and the second drain/source voltage $V_{D2}$ may be equal in (e.g., throughout) the programming phase 601a and/or the erasing phase 601b of the control schema 600.

For example, the first drain/source voltage $V_{D1}$ and/or the second drain/source voltage $V_{D2}$ may be VPP in (e.g., throughout) the programming phase 601a of the control schema 600. For example, the first drain/source voltage $V_{D1}$ and/or the second drain/source voltage $V_{D2}$ may be VSS in (e.g., throughout) the erasing phase 601b of the control schema 600.

Figure 22:
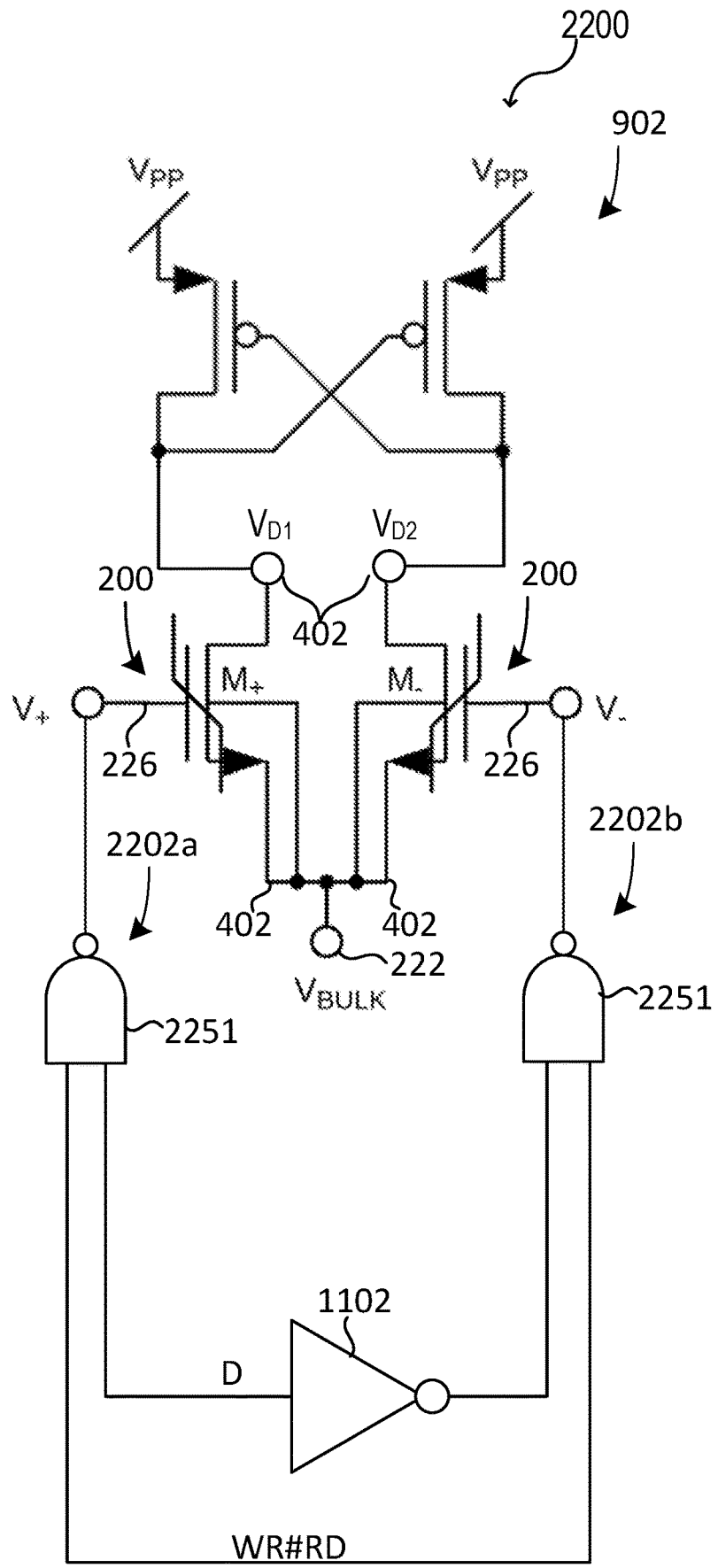
FIG. 22 shows a memory cell in a schematic view, in accordance with various aspects.

FIG. 22 illustrates a memory cell 400 in a schematic circuit diagram, in accordance with various aspects 2200, including two memory cell members 200. As illustrated, the drain-control circuit 902, e.g., its load circuit, may include a latch structure. The latch structure may include a pair of cross coupled transistors. As illustrated, the gate-control circuit 702 may include two branches 2202a, 2202b, which are coupled by an inverter circuit 1102 to each other. Each of the two branches 2202a, 2202b may be further coupled to the driving signal WR/#RD. For example, each of the two branches 2202a, 2202b may include a NAND-gate 2251 (NOT-AND-gate).

Figure 23:
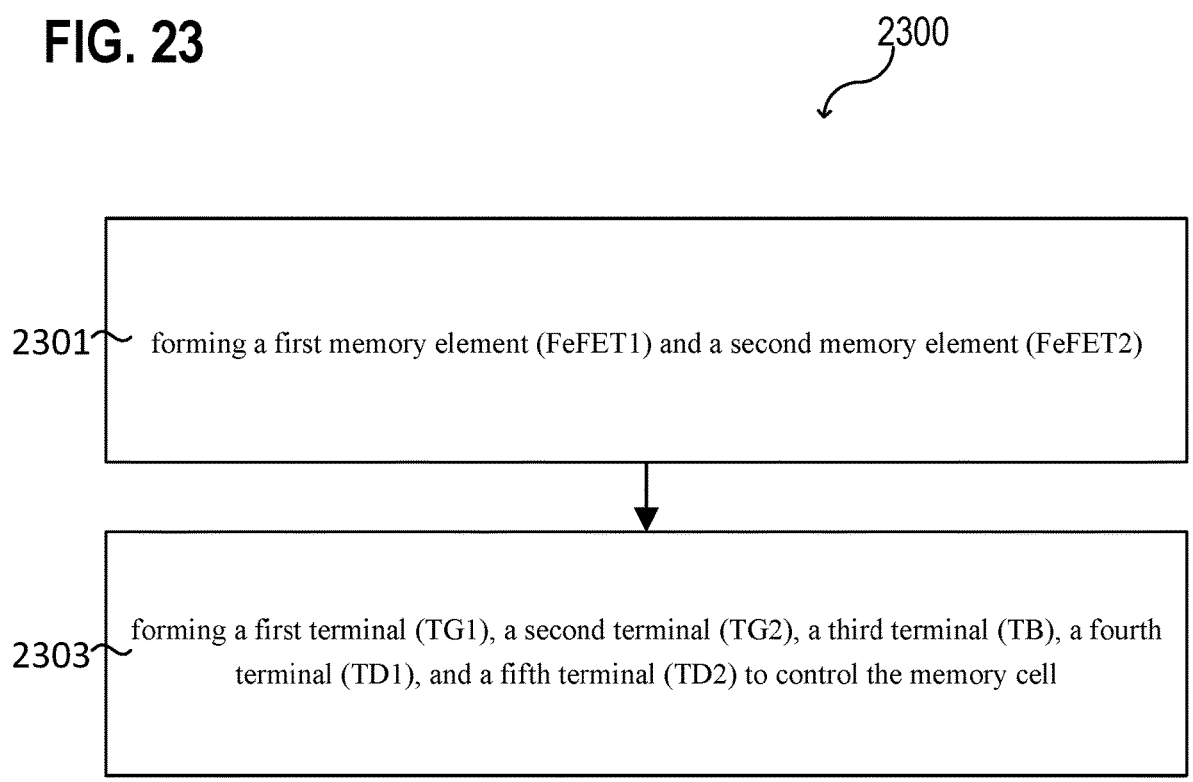
FIG. 23 shows a method in a schematic diagram, in accordance with various aspects.

FIG. 23 illustrates a method 2300 in a schematic diagram, in accordance with various aspects. The method 2300 includes, in 2301, forming a first memory element (FeFET1) and a second memory element (FeFET2), and in 2303, forming a first terminal (TG1), a second terminal (TG2), a third terminal (TB), a fourth terminal (TD1), and a fifth terminal (TD2).

Forming the first memory element (FeFET1) may be configured such that the first memory element includes a first capacitive memory structure electrically connected to the first terminal and a first field-effect transistor structure coupled to the first capacitive memory structure and electrically connected to the third terminal and the forth terminal.

Forming the second memory element (FeFET2) may be configured such that the second memory element includes a second capacitive memory structure electrically connected to the second terminal and a second field-effect transistor structure coupled to the second capacitive memory structure and electrically connected to the third terminal and the fifth terminal.

The first memory element (FeFET1) and the second memory element (FeFET2) may be formed in the same semiconducting region. The semiconducting region may be of the same doping type, e.g., of a p-type doping (also referred to as p-doped) or of an n-type doping (also referred to as n-doped).

According to various aspects, a memory cell as described herein may be integrated in an electronic device (e.g., e.g., a microcontroller, a central processing unit, a system on a chip (SoC), a memory device), for example in a same electronic device with other components, such as components to control logic operations and/or input/output operations of the electronic device. Illustratively, one or more memory transistors may be integrated (and formed) on or in a same carrier as one or more logic transistors and/or one or more input/output transistors.

The word "over," used herein to describe forming a feature, e.g. a layer "over" a side or surface, may be used to mean that the feature, e.g. the layer, may be formed "directly on," e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

The term "lateral" used with regards to a lateral dimension (in other words a lateral extent) of a structure, a portion, a structure element, a layer, etc., provided, for example, over and/or in a carrier (e.g. a layer, a substrate, a wafer, etc.) or "laterally" next to, may be used herein to mean an extent or a positional relationship along a surface of the carrier. That means, in some aspects that a surface of a carrier (e.g. a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. Further, the term "height" used with regards to a height of a structure, a portion, a structure element, a layer, etc., may be used herein to mean a dimension (in other words an extent) of a structure in a direction perpendicular to the surface of a carrier (e.g. perpendicular to the main processing surface of a carrier).

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected."

The term region used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.). In some aspects, the continuous region of a semiconductor portion may be provided by semiconductor material having only one dominant doping type.

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g. parallel to the main processing surface) the "thickness" of the layer formed on the surface of the support may be the same as the height of the layer.

In the following, various aspects of this disclosure will be illustrated.

Example 1 is a memory cell including: a first terminal (e.g., TG1), a second terminal (e.g., TG2), a third terminal (e.g., TB), a fourth terminal (e.g., TD1), and a fifth terminal (e.g., TD2) to control the memory cell; a first (e.g., ferroelectric) memory element (e.g., FeFET1) and a second (e.g., ferroelectric) memory element (e.g., FeFET2), the first memory element including a first capacitive memory structure electrically connected to the first terminal and a first field-effect transistor structure coupled to the first capacitive memory structure and electrically connected to the third terminal and the forth terminal; the second memory element including a second capacitive memory structure electrically connected to the second terminal and a second field-effect transistor structure coupled to the second capacitive memory structure and electrically connected to the third terminal and the fifth terminal.

Example 2 is the memory cell according to example 1, further including: a first control circuit (e.g., a gate control circuit) configured to control a first voltage (VG1) supplied to the first terminal (TG1) and a second voltage (VG2) supplied to the second terminal (TG2).

Example 3 is the memory cell according to example 1 or 2, wherein the capacitive memory structure and the field-effect transistor structure of the first (e.g., ferroelectric) memory element (e.g., FeFET1) and/or the second (e.g., ferroelectric) memory element (e.g., FeFET2) are coupled with one another to form a capacitive voltage divider.

Example 4 is the memory cell according to one of examples 1 to 3, further including: a second control circuit (e.g., drain control circuit) configured to control a fourth voltage (e.g., VD1) supplied to the fourth terminal (e.g., TD1) and a fifth voltage (VD2) supplied to the fifth terminal (e.g., TD2).

Example 5 is the memory cell according to one of examples 1 to 4, wherein the fourth terminal (TD1), and a fifth terminal (TD2) are spatially and/or electrically separated from each other, e.g., by one or more circuit elements (e.g., one or more transistors and/or one or more p-n-junctions).

Example 6 is the memory cell according to one of examples 1 to 5, wherein a source region of the first field-effect transistor structure: is coupled to the third terminal; and/or is doped (e.g., n-doped or p-doped).

Example 7 is the memory cell according to one of examples 1 to 6, wherein a source region of the second field-effect transistor structure: is coupled to the third terminal; and/or is doped (e.g., n-doped or p-doped).

Example 8 is the memory cell according to one of examples 1 to 7, wherein a source region of the first field-effect transistor structure and a source region of the second field-effect transistor structure are coupled with each other, e.g., via the third terminal.

Example 9 is the memory cell according to one of examples 1 to 8, wherein a drain region of the first field-effect transistor structure: is coupled to the fourth terminal; and/or is doped (e.g., n-doped or p-doped).

Example 10 is the memory cell according to one of examples 1 to 9, wherein a drain region of the second field-effect transistor structure: is coupled to the fifth terminal; and/or is doped (e.g., n-doped or p-doped).

Example 11 is the memory cell according to one of examples 1 to 10, wherein a channel region of the first field-effect transistor structure: is doped (e.g., n-doped or p-doped); and/or is disposed between the source region and the drain region of the first field-effect transistor structure; and/or is electrically connected to the third terminal.

Example 12 is the memory cell according to one of examples 1 to 11, wherein a channel region of the second field-effect transistor structure: is doped (e.g., n-doped or p-doped); and/or is disposed between the source region and the drain region of the second field-effect transistor structure; and/or is electrically connected to the third terminal.

Example 13 is the memory cell according to one of examples 1 to 12, further including a substrate including a (e.g., monolithic) semiconductor region (e.g., of the same doping type and/or provided as well), wherein the first memory element and/or second memory element are formed over or in (e.g., embedded in) the semiconductor region; wherein the semiconductor region is p-doped (e.g., provided as p-well region).

Example 14 is the memory cell according to one of examples 1 to 13, being configured as 5-terminal device.

Example 15 is the memory cell according to one of examples 1 to 14, further including a read-out circuit configured to sense a voltage at the fourth terminal (TD1) and/or at the fifth terminal (TD2) and/or to provide an output signal (Q) representing a memory state of the memory cell; wherein, optionally, the output signal (Q) may be based on the sensed voltage at the fourth terminal (TD1) and/or at the fifth terminal (TD2), e.g., based on the sensed voltage either at the fourth terminal (TD1) or at the fifth terminal (TD2).

Example 16 is the memory cell according to example 15, wherein the read-out circuit includes a cascode circuit and/or an inverter circuit.

Example 17 is the memory cell according to one of examples 1 to 16, further including one or more control circuits configured to operate the first memory element and the second memory element differentially.

Example 18 is the memory cell according to one of examples 1 to 17, further including one or more control circuits configured to operate the first memory element and the second memory element according to a control schema; wherein, optionally, the control schema includes multiple phases, e.g., a first phase, a second phase, and/or a third phase.

Example 19 is the memory cell according to example 18, wherein, in the first phase, a first voltage at the first terminal (TG1): differs from (e.g., is more than) a second voltage at the second terminal (TG2); and/or differs from (e.g., is more than) a third voltage at the third terminal (TB).

Example 20 is the memory cell according to example 18 or 19, wherein, in the second phase, the second voltage at the second terminal (TG2): differs from (e.g., is less than) the first voltage at the first terminal (TG1); and/or differs from (e.g., is less than) the third voltage at the third terminal (TB).

Example 21 is the memory cell according to one of examples 18 to 20, wherein the first voltage at the first terminal (TG1) in the first phase (e.g., being VPP) equals the first voltage at the first terminal (TG1) in the second phase and/or in the third phase.

Example 22 is the memory cell according to one of examples 18 to 21, wherein the second voltage at the second terminal (TG2) in the first phase (e.g., being VSS) equals the second voltage at the second terminal (TG2) in the second phase and/or in the third phase.

Example 23 is the memory cell according to one of examples 18 to 22, wherein, in the third phase and/or between the first and second phases, the third voltage at the third terminal (TB) is changed, e.g., changed from VSS to VPP; e.g., changed by more than VDD (e.g., by VPP); and/or, e.g., changed by a difference of the first voltage to the second voltage.

Example 24 is the memory cell according to one of examples 18 to 23, wherein the first voltage at the first terminal (TG1) is changed (e.g., increased) before the first phase (e.g., from VDD and/or to VPP) and/or changed (e.g., degreased) after the second phase and/or the third phase (e.g., from VPP and/or to VDD).

Example 25 is the memory cell according to one of examples 18 to 24, wherein the first voltage at the first terminal (TG1) differs from the second voltage at the second terminal (TG2) before the first phase (e.g., by VDD or less than VPP) and/or after the second phase and/or the third phase (e.g., by VDD or less than VPP).

Example 26 is the memory cell according to one of examples 18 to 25, wherein at least one (e.g., a first control circuit and/or a second control circuit) of the one or more control circuits include a first circuit branch coupled to the first memory element and a second circuit branch coupled to the second memory element; wherein, optionally, the first and second circuit branches are coupled parallel to each other.

Example 27 is the memory cell according to one of examples 18 to 26, wherein at least one (e.g., a first control circuit and/or a second control circuit) of the one or more control circuits (e.g., its first circuit branch) includes a first level shifter.

Example 28 is the memory cell according to one of examples 18 to 27, wherein the at least one (e.g., a first control circuit and/or a second control circuit) of the one or more control circuits (e.g., its second circuit branch) includes a second level shifter.

Example 29 is the memory cell according to one of examples 18 to 28, wherein at least one (e.g., a first control circuit and/or a second control circuit) of the one or more control circuits (e.g., its first circuit branch) includes a first cascode circuit (e.g., including multiple serially coupled transistors).

Example 30 is the memory cell according to one of examples 18 to 29, wherein at least one (e.g., a first control circuit and/or a second control circuit) of the one or more control circuits (e.g., its second circuit branch) includes a second cascode circuit (e.g., including multiple serially coupled transistors).

Example 31 is the memory cell according to one of examples 18 to 30, wherein at least one (e.g., a first control circuit and/or a second control circuit) of the one or more control circuits (e.g., its load circuit) includes a latch structure.

Example 32 is the memory cell according to one of examples 18 to 31, wherein at least one (e.g., a first control circuit) may be configured to control a first voltage at the first terminal (TG1), and/or a second voltage at the second terminal (TG2).

Example 33 is a memory cell according to one of examples 18 to 32, wherein at least one (e.g., a first control circuit) may be configured to control a first voltage at the first terminal (TG1) based on a data signal; and/or to control a second voltage at the second terminal (TG2) based on an invert of the data signal.

Example 34 is the memory cell according to one of examples 18 to 33, wherein at least one (e.g., a first control circuit) may be configured to control a first voltage at the first terminal (TG1) and/or the second voltage at the second terminal (TG2) based on a driving signal, wherein, for example, (e.g., a voltage of) the driving signal represents, if the memory cell is written (e.g., including an erasing operation and/or a programming operation) or if the memory cell is read-out.

Example 35 is the memory cell according to one of examples 18 to 34, wherein at least one (e.g., the second control circuit) may be configured to control a fourth voltage at the fourth terminal (TD1), and/or a fifth voltage at the fifth terminal (TD2).

Example 36 is the memory cell according to one of examples 18 to 35, wherein at least one (e.g., the second control circuit) may be configured to control a fourth voltage at the fourth terminal (TD1), and/or a fifth voltage at the fifth terminal (TD2) based on a high level supply voltage (e.g., VPP), wherein, for example, the high level supply voltage is: more than a low level supply voltage (e.g., VDD) supplied to one or more inverter circuits of the memory cell; and/or more than or equal to a switching voltage of the first memory element (also referred to as) of the second memory element.

Example 37 is the memory cell according to one of examples 18 to 36, wherein at least one (e.g., a first control circuit and/or a second control circuit) of the one or more control circuits (e.g., its second circuit branch) is coupled to an externally provided high level supply voltage (e.g., VPP), wherein, for example, the high level supply voltage is: more than a low level supply voltage (e.g., VDD) supplied to one or more inverter circuits of the memory cell; and/or more than or equal to a switching voltage of the first memory element (also referred to as) of the second memory element.

Example 38 is the memory cell according to one of examples 1 to 37, wherein, for at least one memory element of the first and second memory elements, a gate structure (also referred to as gate) of the field-effect transistor structure of the at least one memory element includes a gate electrode and a gate isolation separating the gate electrode from a channel region of the field-effect transistor structure, and/or wherein the gate electrode is coupled to a first electrode of the capacitive memory structure of the at least one memory element.

Example 39 is the memory cell according to example 38, wherein the gate isolation extends from the channel region of the field-effect transistor structure to the gate electrode of the field-effect transistor structure.

Example 40 is the memory cell according to one of examples 1 to 39, wherein, for at least one memory element of the first and second memory elements, the field-effect transistor structure of the at least one memory element includes a gate electrode layer and wherein the first electrode of the capacitive memory structure of the at least one memory element includes a first electrode layer, wherein the first electrode layer and the gate electrode layer are spatially separated from one another and electrically conductively connected to one another.

Example 41 is the memory cell according to one of examples 1 to 40, wherein, for at least one memory element of the first and second memory elements, the field-effect transistor structure of the at least one memory element includes a gate electrode layer and wherein the first electrode of the capacitive memory structure of the at least one memory element includes a first electrode layer, wherein the first electrode layer and the gate electrode layer are in direct physical contact with one another.

Example 42 is the memory cell according to one of examples 1 to 41, wherein, for at least one memory element of the first and second memory elements, the field-effect transistor structure of the at least one memory element includes a gate electrode, wherein the gate electrode and the first electrode of the capacitive memory structure of the at least one memory element are provided by a common electrode layer.

Example 43 is the memory cell according to one of examples 1 to 42, wherein, for at least one memory element of the first and second memory elements, the capacitive memory structure of the at least one memory element includes one or more remanent-polarizable layers.

Example 44 is the memory cell according to example 43, wherein a material of the one or more remanent-polarizable layers includes at least one of the following: hafnium oxide, zirconium oxide, a mixture of hafnium oxide and zirconium oxide.

Example 45 is the memory cell according to one of examples 1 to 44, wherein, for at least one memory element of the first and second memory elements, the capacitive memory structure of the at least one memory element includes one or more spontaneously-polarizable layers and one or more charge storage layers.

Example 46 is the memory cell according to one of examples 1 to 45, wherein, for the capacitive memory structure of the first and second memory elements, a first electrode material of the capacitive memory structure includes a basic material having a work-function associated therewith and a first doping material that increases the work-function of the basic material (e.g., with higher doping amount).

Example 47 is the memory cell according to one of examples 1 to 46, wherein, for the capacitive memory structure of the first and second memory elements, a second electrode material of the capacitive memory structure includes the basic material and a second doping material that decreases the work-function of the basic material (e.g., with higher doping amount).

Example 48 is the memory cell according to one of examples 1 to 47, wherein, for the capacitive memory structure of the first and second memory elements, at least one of a first electrode of the capacitive memory structure and a second electrode of the capacitive memory structure is a multilayer electrode, the multilayer electrode including one or more layers of a first material and one or more layers of a second material, wherein a work-function of the first material is different from a work-function of the second material.

Example 49 is the memory cell according to example 48, wherein the first electrode is provided by one or more electrode layers having a first total thickness and wherein the second electrode is provided by one or more electrode layers having a second total thickness that is different from the first total thickness.

Example 50 is the memory cell according to one of examples 1 to 49, wherein a thickness of the first electrode and/or a thickness of the second electrode are/is configured to adapt the work-function of the first electrode material and the second electrode material respectively.

Example 51 is the memory cell according to one of examples 1 to 50, each memory element of the first and second memory elements including: a first electrode including a first electrode material having a first work-function; a second electrode including a second electrode material having a second work-function; and a functional layer of the capacitive memory structure disposed between the first electrode and the second electrode, wherein the first work-function of the first electrode material is different from the second work-function of the second electrode material.

Example 52 is the memory cell according to one of examples 1 to 51, wherein the capacitive memory structure (e.g., its functional layer) includes one or more remanent-polarizable layers, or wherein the capacitive memory structure includes (e.g., its functional layer) one or more spontaneously-polarizable layers and one or more charge storage layers.

Example 53 is the memory cell according to one of examples 1 to 52, wherein the first terminal (e.g., TG1), the second terminal (e.g., TG2), the third terminal (e.g., TB), the fourth terminal (e.g., TD1), and the fifth terminal (e.g., TD2) are spatially and/or electrically separated from each other.

Example 54 is a method of forming a memory cell, the method including: forming a first memory element (e.g., FeFET1) and a second memory element (e.g., FeFET2), forming a first terminal (e.g., TG1), a second terminal (e.g., TG2), a third terminal (e.g., TB), a fourth terminal (e.g., TD1), and a fifth terminal (e.g., TD2) to control the memory cell; the first memory element including a first capacitive memory structure electrically connected to the first terminal and a first field-effect transistor structure coupled to the first capacitive memory structure and electrically connected to the third terminal and the forth terminal; the second memory element including a second capacitive memory structure electrically connected to the second terminal and a second field-effect transistor structure coupled to the second capacitive memory structure and electrically connected to the third terminal and the fifth terminal.

According to various aspects, a memory circuit is provided, see, for example, FIG. 15, wherein a supply circuit (also referred to as a control circuit) may receive a read/write command (e.g., a driving signal WR/#RD) to operate a plurality of memory cells. The memory cells are configured, e.g., include one or more control circuits (e.g., a drain control circuit, a gate control circuit, and/or bulk control circuit, as examples), to receive a set of control signals from the supply circuit and to—based on the reception of the set of control signals—either output (e.g., simultaneously) signals representing the respective memory state in which the memory cells are residing in or write (e.g., simultaneously) the memory state of the memory cells in accordance with a data input signal. Illustratively, no other memory control overhead may be needed in this configuration to read and/or write the memory cells. The set of signals include a plurality of signals (e.g., at least three signals, e.g., at least four signals, e.g., at least five signals, e.g., at least seven signals) to control the control circuits (e.g., a drain control circuit, a gate control circuit, and/or bulk control circuit, as examples) included in each of the memory cells. The number of signals may be related to a number of different functions of the memory cell. More signals (e.g., at least two additional signals, $V_{BN}$, $V_{BP}$, as examples) may be needed in the case that a high-voltage protection (e.g., one or more cascodes) is implemented in the memory cells. In some aspects, the gate voltages (e.g., the first gate voltage $V_+$, e.g., the second gate voltage $V_-$) may have a function similar to a word-line voltage; and the bulk voltage (e.g., $V_{BULK}$, also referred to as VS/B) may have a function similar to a source-line voltage; these voltages may be used by all of the plurality of memory cells in common. The drain voltages (e.g., the drain/source voltages VD1, VD2) may be generated individually for each memory cell. In some aspects, the drain voltages (e.g., the drain/source voltages VD1, VD2) may be generated individually by the drain control circuit included in each of the memory cells.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell comprising:
a first terminal, a second terminal, a third terminal, a fourth terminal, and a fifth terminal to control the memory cell;
a first memory element and a second memory element;
the first memory element comprising a first capacitive memory structure electrically connected to the first terminal and a first field-effect transistor structure coupled to the first capacitive memory structure and electrically connected to the third terminal and the fourth terminal;
the second memory element comprising a second capacitive memory structure electrically connected to the second terminal and a second field-effect transistor structure coupled to the second capacitive memory structure and electrically connected to the third terminal and the fifth terminal.

2. Memory cell according to claim 1, wherein the first capacitive memory structure and the first field-effect transistor structure are coupled with one another to form a capacitive voltage divider; and/or wherein the second capacitive memory structure and the second field-effect transistor structure are coupled with one another to form a capacitive voltage divider.

3. Memory cell according to claim 1, wherein a source region of the first field-effect transistor structure is coupled to the third terminal.

4. Memory cell according to claim 1, wherein a source region of the second field-effect transistor structure is coupled to the third terminal.

5. Memory cell according to claim 1, wherein a drain region of the first field-effect transistor structure is coupled to the fourth terminal.

6. Memory cell according to claim 1, wherein a drain region of the second field-effect transistor structure is coupled to the fifth terminal.

7. Memory cell according to claim 1, further comprising: a substrate comprising a semiconductor region of a same doping type, wherein the first memory element and the second memory element are embedded in the semiconductor region.

8. Memory cell according to claim 1, further comprising:
a read-out circuit configured to sense a voltage at the fourth terminal and/or at the fifth terminal and/or to provide an output signal (Q) representing a memory state of the memory cell based on the sensed voltage at the fourth terminal or at the fifth terminal.

9. Memory cell according to claim 1, further comprising one or more control circuits configured to operate the first memory element and the second memory element differentially; and/or the first memory element and the second memory element according to a control schema.

10. Memory cell according to claim 9, wherein, in a first phase of the control schema, a first voltage at the first terminal is more than a second voltage at the second terminal and is more than a third voltage at the third terminal.

11. Memory cell according to claim 10, wherein, in a second phase of the control schema, a second voltage at the second terminal is less than the first voltage at the first terminal and is less than the third voltage at the third terminal.

12. Memory cell according to claim 11, wherein the first voltage at the first terminal is increased before the first phase and decreased after the second phase.

13. Memory cell according to claim 9, wherein at least one of the one or more control circuits includes a first circuit branch coupled to the first memory element and a second circuit branch coupled to the second memory element; wherein the first circuit branch and the second circuit branch are coupled parallel to each other.

14. Memory cell according to claim 9, wherein at least one of the one or more control circuits comprises a level shifter.

15. Memory cell according to claim 9, wherein at least one of the one or more control circuits comprises a cascode circuit.

16. Memory cell according to claim 9, wherein at least one of the one or more control circuits comprises a latch structure.

17. Memory cell according to claim 1, wherein the first capacitive memory structure and/or the second capacitive memory structure comprise one or more remanent-polarizable layers.

18. Memory cell according to claim 17, wherein a material of the one or more remanent-polarizable layers comprises at least one of:
hafnium oxide,
zirconium oxide, or
a mixture of hafnium oxide and zirconium oxide.

19. A memory cell comprising:
a first terminal, a second terminal, a third terminal, a fourth terminal, and a fifth terminal to control the memory cell;
a first ferroelectric memory element and a second ferroelectric memory element,
the first ferroelectric memory element comprising a first capacitive memory structure electrically connected to the first terminal and a first field-effect transistor structure coupled to the first capacitive memory structure and electrically connected to the third terminal and the fourth terminal;
the second ferroelectric memory element comprising a second capacitive memory structure electrically connected to the second terminal and a second field-effect transistor structure coupled to the second capacitive memory structure and electrically connected to the third terminal and the fifth terminal.

20. A method of forming a memory cell, the method comprising:
forming a first memory element and a second memory element; and
forming a first terminal, a second terminal, a third terminal, a fourth terminal, and a fifth terminal to control the memory cell;
the first memory element comprising a first capacitive memory structure electrically connected to the first terminal and a first field-effect transistor structure coupled to the first capacitive memory structure and electrically connected to the third terminal and the fourth terminal;
the second memory element comprising a second capacitive memory structure electrically connected to the second terminal and a second field-effect transistor structure coupled to the second capacitive memory structure and electrically connected to the third terminal and the fifth terminal.

* * * * *